United States Patent
Lu et al.

(10) Patent No.: US 12,080,815 B2
(45) Date of Patent: *Sep. 3, 2024

(54) LASER ASSISTED METALLIZATION PROCESS FOR SOLAR CELL STRINGING

(71) Applicant: Maxeon Solar Pte. Ltd., Singapore (SG)

(72) Inventors: Pei Hsuan Lu, San Jose, CA (US); Benjamin I. Hsia, Fremont, CA (US); David Aaron Randolph Barkhouse, Oakland, CA (US); Lewis C. Abra, San Francisco, CA (US); George G. Correos, Corralitos, CA (US); Marc Robinson, Cedar Park, TX (US); Paul W. Loscutoff, Castro Valley, CA (US); Ryan Reagan, Hayward, CA (US); David Okawa, Redwood City, CA (US); Tamir Lance, Los Gatos, CA (US); Thierry Nguyen, San Francisco, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/137,935

(22) Filed: Apr. 21, 2023

(65) Prior Publication Data
US 2023/0253517 A1 Aug. 10, 2023

Related U.S. Application Data

(60) Continuation-in-part of application No. 16/376,802, filed on Apr. 5, 2019, now Pat. No. 11,362,220, and
(Continued)

(51) Int. Cl.
*H01L 31/0465* (2014.01)
*H01L 31/0224* (2006.01)
(Continued)

(52) U.S. Cl.
CPC .. *H01L 31/0465* (2014.12); *H01L 31/022433* (2013.01); *H01L 31/0475* (2014.12); *H01L 31/049* (2014.12); *H01L 31/0508* (2013.01)

(58) Field of Classification Search
CPC . H01L 31/065; H01L 31/0475; H01L 31/049; H01L 31/022433; H01L 31/0508; H01L 31/1876
See application file for complete search history.

(56) References Cited

U.S. PATENT DOCUMENTS

| 3,993,533 A | 11/1976 | Milnes et al. |
| 4,023,005 A | 5/1977 | Bolin |

(Continued)

FOREIGN PATENT DOCUMENTS

| CN | 1221224 A | 6/1999 |
| CN | 102132423 | 7/2011 |

(Continued)

OTHER PUBLICATIONS

Office Action from Japanese Patent Application No. 2020-554537 dated Feb. 28, 2023, 11 pgs.
(Continued)

*Primary Examiner* — Andrew J Golden
(74) *Attorney, Agent, or Firm* — Schwabe, Williamson & Wyatt, P.C.

(57) ABSTRACT

Metallization of semiconductor substrates using a laser beam, and the resulting structures, e.g., micro-electronic devices, semiconductor substrates and/or solar cells, solar cell circuit, solar cell strings, and solar cell arrays are described. A solar cell string can include a plurality of solar cells. The plurality of solar cells can include a substrate and a plurality of semiconductor regions disposed in or above the substrate. A plurality of conductive contact structures is electrically connected to the plurality semiconductor
(Continued)

regions. Each conductive contact structure includes a locally deposited metal portion disposed in contact with a corresponding one of the semiconductor regions.

8 Claims, 19 Drawing Sheets

Related U.S. Application Data a division of application No. 16/377,000, filed on Apr. 5, 2019, now Pat. No. 11,664,472.

(60) Provisional application No. 62/773,168, filed on Nov. 29, 2018, provisional application No. 62/773,172, filed on Nov. 29, 2018, provisional application No. 62/773,148, filed on Nov. 29, 2018, provisional application No. 62/654,198, filed on Apr. 6, 2018.

(51) Int. Cl.
  H01L 31/0475 (2014.01)
  H01L 31/049 (2014.01)
  H01L 31/05 (2014.01)

(56) References Cited

U.S. PATENT DOCUMENTS

| | | | |
|---|---|---|---|
| 4,058,418 A | 11/1977 | Lindmayer | |
| 4,318,938 A | 3/1982 | Barnett et al. | |
| 4,393,576 A | 7/1983 | Dahlberg | |
| 4,400,577 A | 8/1983 | Spear | |
| 4,433,200 A | 2/1984 | Jester et al. | |
| 4,461,922 A | 7/1984 | Gay et al. | |
| 4,482,780 A | 11/1984 | Mitchell | |
| 4,581,103 A | 4/1986 | Levine et al. | |
| 4,582,588 A | 4/1986 | Jensen et al. | |
| 4,617,421 A | 10/1986 | Nath et al. | |
| 4,691,076 A | 9/1987 | Levine et al. | |
| 4,695,674 A | 9/1987 | Bar-on | |
| 4,697,041 A | 9/1987 | Okaniwa et al. | |
| 4,882,298 A | 11/1989 | Moeller et al. | |
| 4,917,752 A | 4/1990 | Jensen et al. | |
| 4,957,601 A | 9/1990 | Levine et al. | |
| 5,091,319 A | 2/1992 | Hotchkiss et al. | |
| 5,380,371 A | 1/1995 | Murakami | |
| 5,951,786 A | 9/1999 | Gee et al. | |
| 5,980,679 A | 11/1999 | Severin et al. | |
| 6,159,832 A | 12/2000 | Mayer | |
| 6,288,326 B1 | 9/2001 | Hayashi et al. | |
| 6,448,155 B1 | 9/2002 | Iwasaki et al. | |
| 6,635,307 B2 | 10/2003 | Huang et al. | |
| 7,355,114 B2 | 4/2008 | Ojima et al. | |
| 7,687,334 B2 | 3/2010 | Zou et al. | |
| 8,003,530 B2 | 8/2011 | Grohe et al. | |
| 8,146,643 B2 | 4/2012 | Kasahara et al. | |
| 8,809,192 B2 | 8/2014 | Bertram et al. | |
| 9,040,409 B2 | 5/2015 | Kumar et al. | |
| 9,620,661 B2 | 4/2017 | Kim et al. | |
| 2001/0029976 A1 | 10/2001 | Takeyama et al. | |
| 2002/0159740 A1 | 10/2002 | Beall et al. | |
| 2005/0253142 A1 | 11/2005 | Negami et al. | |
| 2006/0166023 A1 | 7/2006 | Yoshikata et al. | |
| 2006/0213548 A1 | 9/2006 | Bachrach et al. | |
| 2008/0042153 A1 | 2/2008 | Beeson et al. | |
| 2008/0053511 A1 | 3/2008 | Nakamura | |
| 2008/0128019 A1 | 6/2008 | Lopatin et al. | |
| 2008/0216887 A1 | 9/2008 | Hacke et al. | |
| 2008/0223429 A1 | 9/2008 | Everett et al. | |
| 2009/0194162 A1 | 8/2009 | Sivaram et al. | |
| 2009/0266399 A1 | 10/2009 | Bulent et al. | |
| 2009/0305076 A1 | 12/2009 | Wong et al. | |
| 2009/0314344 A1 | 12/2009 | Fork et al. | |
| 2010/0032013 A1 | 2/2010 | Krause et al. | |
| 2010/0051085 A1 | 3/2010 | Weidman et al. | |
| 2010/0084748 A1 | 4/2010 | Poddar et al. | |
| 2010/0200058 A1 | 8/2010 | Funakoshi | |
| 2010/0243041 A1 | 9/2010 | Carlson et al. | |
| 2010/0275965 A1 | 11/2010 | Lee et al. | |
| 2011/0073165 A1 | 3/2011 | Lee | |
| 2011/0076847 A1 | 3/2011 | Aqui et al. | |
| 2011/0120752 A1 | 5/2011 | Imai et al. | |
| 2011/0136265 A1 | 6/2011 | Shigenobu et al. | |
| 2011/0186117 A1 | 8/2011 | Kumar et al. | |
| 2012/0097245 A1 | 4/2012 | Nishina et al. | |
| 2012/0103408 A1 | 5/2012 | Moslehi et al. | |
| 2012/0234388 A1 | 9/2012 | Stancel et al. | |
| 2012/0240995 A1 | 9/2012 | Coakley | |
| 2013/0068287 A1 | 3/2013 | Compaan | |
| 2013/0112233 A1 | 5/2013 | Coakley | |
| 2013/0160825 A1 | 6/2013 | Lantzer et al. | |
| 2013/0183796 A1 | 7/2013 | Stewart et al. | |
| 2013/0247977 A1 | 9/2013 | Kumai et al. | |
| 2014/0113400 A1 | 4/2014 | Takahashi | |
| 2014/0190546 A1 | 7/2014 | Fukumochi et al. | |
| 2014/0338739 A1 | 11/2014 | Liu et al. | |
| 2015/0004737 A1 | 1/2015 | Harley | |
| 2015/0090329 A1 | 4/2015 | Pass | |
| 2015/0129031 A1 | 5/2015 | Moslehi et al. | |
| 2015/0179870 A1 | 6/2015 | Moors et al. | |
| 2015/0325710 A1 | 11/2015 | Tu | |
| 2016/0020343 A1 | 1/2016 | Carlson | |
| 2016/0133759 A1 | 5/2016 | Pass et al. | |
| 2016/0181447 A1 | 6/2016 | Kim et al. | |
| 2016/0268455 A1 | 9/2016 | Levy et al. | |
| 2017/0062633 A1 | 3/2017 | Carlson et al. | |
| 2017/0116808 A1 | 4/2017 | Kobrin | |
| 2017/0179312 A1 | 6/2017 | Kim et al. | |
| 2017/0250297 A1 | 8/2017 | Harley | |
| 2017/0330993 A1 | 11/2017 | Sewell et al. | |
| 2017/0365731 A1 | 12/2017 | Lin et al. | |
| 2018/0097129 A1 | 4/2018 | Pass | |

FOREIGN PATENT DOCUMENTS

| | | |
|---|---|---|
| DE | 10020412 | 11/2001 |
| EP | 1634673 | 3/2006 |
| JP | 1999186572 A | 7/1999 |
| JP | H11186572 A | 7/1999 |
| JP | 2003/246971 | 9/2003 |
| JP | 2009/130116 | 6/2009 |
| JP | 2011/054831 | 3/2011 |
| JP | 2012/501551 | 1/2012 |
| JP | 2016525791 A | 8/2016 |
| KR | 10-1267398 | 1/2013 |
| KR | 2013/0005727 | 1/2013 |
| TW | 2010/27773 | 7/2010 |
| WO | WO 1999/040760 | 8/1999 |
| WO | WO 2010/025269 | 3/2010 |
| WO | WO 2013/142892 | 10/2013 |
| WO | WO 2014/023668 | 2/2014 |
| WO | 2014209532 A1 | 12/2014 |
| WO | WO 2016/036224 | 3/2016 |
| WO | 2016133695 A1 | 8/2016 |

OTHER PUBLICATIONS

Hearing Report from Indian Application No. 202027048397 dated Oct. 19, 2023, 2 pgs.

First Office Action from Chinese Patent Application No. 201980030792.8 dated Apr. 28, 2023, 9 pgs.

Lu, et al., "Laser-Doping through Anodic Aluminum Oxide Layers for Silicon Solar Cells," Journal of Nanomaterials, vol. 2015, Article ID 870839, Jul. 1, 2015, 6 pages.

Nekarda, et al., "Laser-Based Foil Metallization for Industrial Perc Solar Cells," Presented at the 28th European Photovoltaic Solar Energy Conference and Exhibition; Paris, Sep. 30-Oct. 2013, 3 pgs.

Graf, et al., "Foil Metallization Process for Perc Solar Cells Towards Industrial Feasibility," Presented at the 31st European PV Solar Energy Conference and Exhibition, Sep. 14-18, 2015, Hamburg, Germany, 4 pgs.

(56) References Cited

OTHER PUBLICATIONS

Schulte-Huxel, et al., "Al-Foil on Encapsulant for the Interconnection of Al-Metalized Silicon Solar Cells," Article in IEEE Journal of Photovoltaics—Jan. 2013, 7 pgs.
Schulte-Huxel, et al., "Laser microwelding of thin Al layers for interconnection of crystalline Si solar cells: analysis of process limits for ns and μs lasers," Article in Journal of Photonics for Energy—Aug. 2014, 15 pgs.
Schulte-Huxel, et al., "Aluminum-Based Mechanical and Electrical Laser Interconnection Process for Module Integration of Silicon Solar Cells," in IEEE Journal of Photovoltaics, vol. 2, No. 1, pp. 16-21, Jan. 2012, 6 pgs.
Schulte-Huxel, et al., "Simultaneous Contacting and Interconnection of Passivated Emitter and Rear Solar Cells," Energy Procedia, Elsevier, NL, vol. 92, Sep. 23, 2016, pp. 515-522.
Merriam Webster Dictionary definition for Discrete, https;//www.merriam-webster.com/dictionary/discrete (Year: 2009).
Roder, et al. 30 μm Wide Contacts on Silicon Cells by Laser Transfer, 2010, 35th IEEE Photovoltaic Specialists Conference, Honolulu, HI, USA, 2010, pp. 003597-003599 (Year: 2010).
Cotter, et al., "Novel Process for Simplified Buried Contact Solar Cells," Institute of Electrical and Electronics Engineers, Aug. 2000, pp. 303-306.
International Search Report and Written Opinion from PCT/US2019/026189 mailed Jul. 25, 2019; 11 pgs.
International Search Report and Written Opinion from PCT/US2019/026188 mailed Jul. 25, 2019; 12 pgs.
International Search Report and Written Opinion from PCT/US2019/026186 mailed Jul. 25, 2019; 12 pgs.
International Search Report and Written Opinion from PCT/US2019/026151 mailed Jul. 31, 2019; 12 pgs.
International Search Report and Written Opinion from PCT/US2019/026166 mailed Aug. 2, 2019, 12 pgs.
Non-final Notice of Reasons for Rejection from Japanese Patent Application No. 2018-182848 dated Oct. 16, 2019, 7 pgs.
Pre-Interview First Office Action from U.S. Appl. No. 16/376,802 mailed Dec. 2, 2019; 13 pgs.
Pre-Interview First Office Action from U.S. Appl. No. 16/377,102 mailed Dec. 20, 2019; 12 pgs.
Pre-Interview First Office Action from U.S. Appl. No. 16/377,074 mailed Dec. 27, 2019; 13 pgs.
FAI Pre-Interview Communication from U.S. Appl. No. 16/377,000 dated Mar. 2, 2020, 13 pgs.
FAI Office Action from U.S. Appl. No. 16/376,802 mailed Mar. 23, 2020; 5 pgs.
FAI Office Action from U.S. Appl. No. 16/377,074 mailed Mar. 23, 2020; 5 pgs.
FAI Office Action from U.S. Appl. No. 16/377,102 mailed Mar. 23, 2020; 7 pgs.
FAI Office Action from U.S. Appl. No. 16/377,000 dated Jun. 8, 2020, 3 pgs.
International Search Report and Written Opinion from PCT/US2019/026190 mailed Sep. 22, 2020; 9 pgs.
Final Office Action from U.S. Appl. No. 16/376,802 mailed Oct. 14, 2020; 18 pgs.
Final Office Action from U.S. Appl. No. 16/377,074 mailed Oct. 14, 2020; 25 pgs.
Final Office Action from U.S. Appl. No. 16/377,102 mailed Oct. 14, 2020; 20 pgs.
International Preliminary Report on Patentability from PCT/US2019/026189 mailed Oct. 15, 2020; 8 pgs.
International Preliminary Report on Patentability from PCT/US2019/026186 mailed Oct. 15, 2020; 9 pgs.
International Preliminary Report on Patentability from PCT/US2019/026190 mailed Oct. 15, 2020; 6 pgs.
International Preliminary Report on Patentability from PCT/US2019/026151 mailed Oct. 15, 2020; 9 pgs.
International Preliminary Report on Patentability from PCT/US2019/026188 mailed Oct. 15, 2020; 9 pgs.
International Preliminary Report on Patentability from PCT/US2019/026166 mailed Oct. 15, 2020, 9 pgs.
Final Office Action from U.S. Appl. No. 16/377,000 dated Oct. 27, 2020, 20 pgs.
Pre-Interview First Office Action from U.S. Appl. No. 16/377,053 mailed Nov. 12, 2020; 16 pgs.
FAI Office Action from U.S. Appl. No. 16/377,053 mailed Feb. 16, 2021; 5 pgs.
Non-Final Office Action from U.S. Appl. No. 16/376,802 mailed Mar. 3, 2021; 24 pgs.
Non-Final Office Action from U.S. Appl. No. 16/377,102 mailed Mar. 3, 2021; 21 pgs.
Extended European Search Report from European Patent Application No. 19781261.3 mailed Mar. 31, 2021; 13 pgs.
Non-Final Office Action from U.S. Appl. No. 16/377,074 mailed Apr. 28, 2021; 32 pgs.
Non-Final Office Action from U.S. Appl. No. 16/377,000 dated Apr. 28, 2021, 23 pgs.
Final Office Action from U.S. Appl. No. 16/377,053 mailed Aug. 21, 2021; 18 pgs.
Final Office Action from U.S. Appl. No. 16/377,000 dated Oct. 22, 2021, 23 pgs.
Non-Final Office Action from U.S. Appl. No. 16/377,000 dated Apr. 11, 2022, 26 pgs.
Examination Report from Indian Patent Application No. 202027048397 dated Aug. 30, 2022, 17 pgs.
Examination Report No. 1 from Australian Patent Application No. 2019249270 dated Jun. 27, 2022, 4 pgs.
Final Office Action from U.S. Appl. No. 16/377,000 dated Sep. 23, 2022, 24 pgs.
Office Action from European Patent Application No. 19782324.8 dated Jan. 3, 2023, 6 pgs.
Second Office Action from Chinese Patent Application No. 201980030792.8 dated Nov. 23, 2023, 21 pgs.

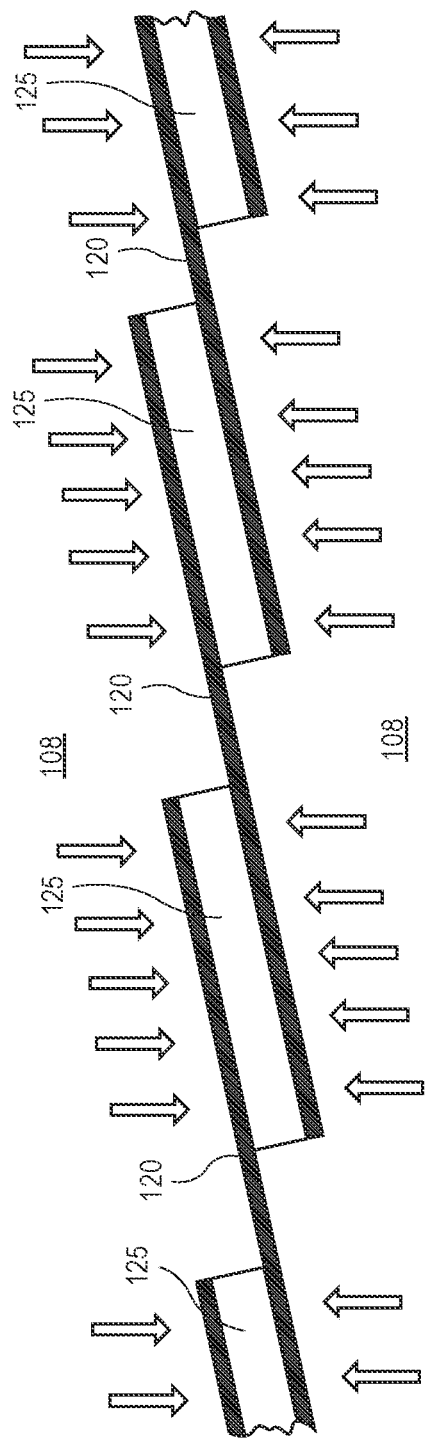
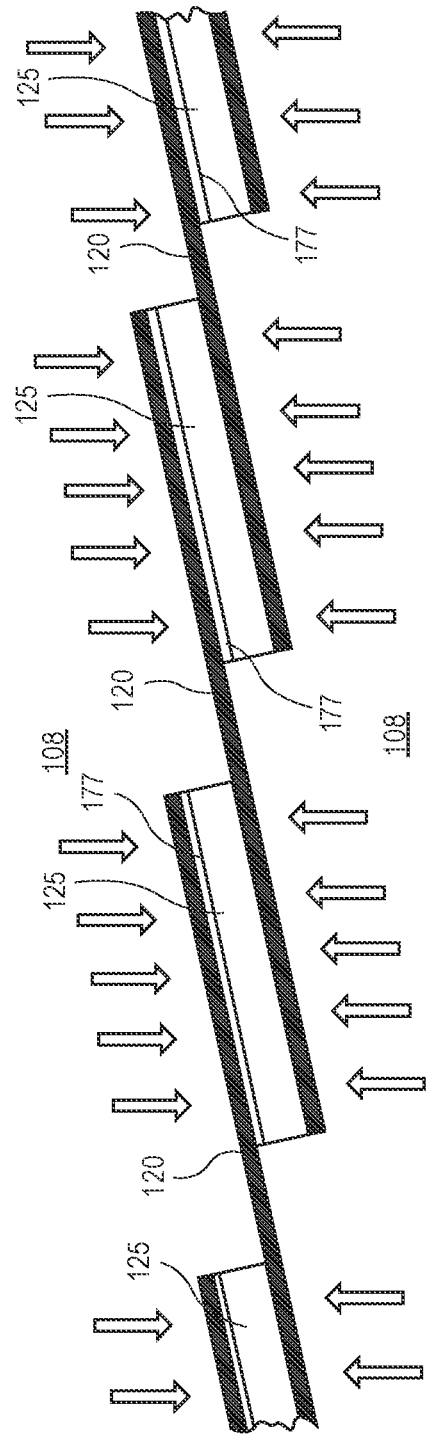
FIG. 11
FIG. 12

LASER ASSISTED METALLIZATION PROCESS FOR SOLAR CELL STRINGING

CROSS-REFERENCE TO RELATED APPLICATIONS

This application is a divisional of U.S. patent application Ser. No. 16/377,000 filed on Apr. 5, 2019, which claims the right of priority to and benefit of earlier filing date of U.S. Provisional Application No. 62/773,172, filed on Nov. 29, 2018, U.S. Provisional Application No. 62/773,168, filed on Nov. 29, 2018, U.S. Provisional Application No. 62/773,148, filed on Nov. 29, 2018, and U.S. Provisional Application No. 62/654,198, filed on Apr. 6, 2018, each of which is hereby incorporated by reference herein in its entirety. This application also claims the right of priority to and benefit of earlier filing of U.S. patent application Ser. No. 16/376,802, filed Apr. 5, 2019, titled "Local Metallization for Semiconductor Substrates using a Laser Beam," now U.S. Pat. No. 11,362,220, issued Jun. 14, 2022, which is hereby incorporated by reference in its entirety.

TECHNICAL FIELD

Embodiments of the present disclosure are in the field of renewable energy or semiconductor processing and, in particular, include metallization of semiconductor substrates using a laser beam, and the resulting structures.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Electrical conversion efficiency is an important characteristic of a solar cell as it is directly related to the capability of the solar cell to generate power; with higher efficiency providing additional value to the end customer; and, with all other things equal, higher efficiency also reduces manufacturing cost per Watt. Likewise, simplified manufacturing approaches provide an opportunity to lower manufacturing costs by reducing the cost per unit produced. Accordingly, techniques for increasing the efficiency of solar cells and techniques for simplifying the manufacturing of solar cells are generally desirable.

BRIEF DESCRIPTION OF THE DRAWINGS

FIG. 11 illustrates a side view of a method of fabricating a solar cell string.

FIG. 12 illustrates a side view of a method of fabricating a solar cell string.

DETAILED DESCRIPTION

Figure 1A:
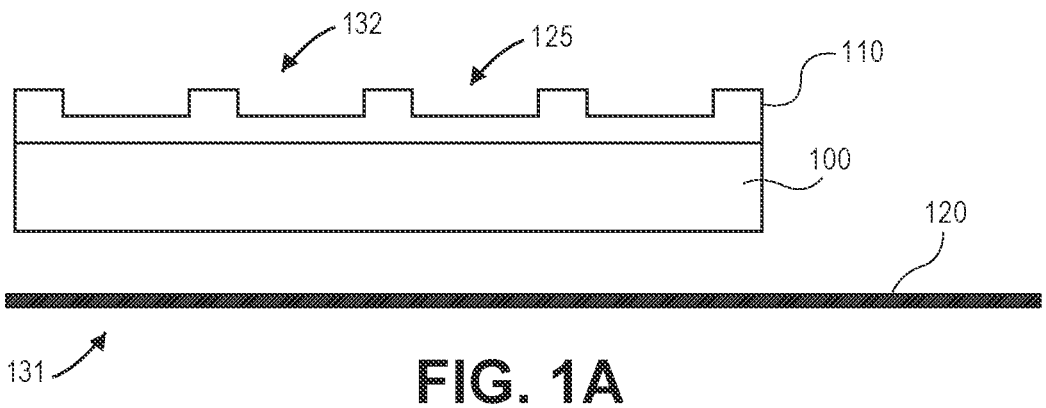
FIGS. 1A-1F illustrate side views of operations in a method of fabricating a solar cell string.

The following detailed description is merely illustrative in nature and is not intended to limit the embodiments or the application and uses of such embodiments. As used herein, the word "exemplary" means "serving as an example, instance, or illustration." Any implementation described herein as exemplary is not necessarily preferred or advantageous over other implementations. Furthermore, there is no intention to be bound by any expressed or implied theory presented in the preceding technical field, background, brief summary or the following detailed description.

References to "one embodiment" or "an embodiment" do not necessarily refer to the same embodiment. Particular features, structures, or characteristics can be combined in any suitable manner consistent with this disclosure.

Terminology. The following paragraphs provide definitions and/or context for terms found in this disclosure (including the appended claims):

"Regions" or "portions" describe discrete areas, volumes, divisions or locations of an object or material having definable characteristics but not always fixed boundaries.

"Comprising" is an open-ended term that does not foreclose additional structure or steps.

"Configured to" connotes structure by indicating a device, such as a unit or a component, includes structure that performs a task or tasks during operation, and such structure is configured to perform the task even when the device is not currently operational (e.g., is not on/active). A device "configured to" perform one or more tasks is expressly intended to not invoke a means or step plus function interpretation under 35 U.S.C. § 112, (f) or sixth paragraph.

"First," "second," etc. terms are used as labels for nouns that they precede, and do not imply any type of ordering (e.g., spatial, temporal, logical, etc.). For example, reference to a "first" solar cell does not necessarily mean such solar cell is the first solar cell in a sequence; instead the term "first" is used to differentiate this solar cell from another solar cell (e.g., a "second" solar cell).

"Coupled" refers to elements, features, structures or nodes, unless expressly stated otherwise, that are or can be directly or indirectly joined or in communication with another element/node/feature, and not necessarily directly mechanically joined together.

"Inhibit" describes reducing, lessening, minimizing or effectively or actually eliminating something, such as completely preventing a result, outcome or future state completely.

"Exposed to a laser beam" describes a process subjecting a material to incident laser light, and can be used interchangeably with "subjected to a laser," "processed with a laser" and other similar phrases.

"Doped regions," "semiconductor regions," and similar terms describe regions of a semiconductor disposed in, on, above or over a substrate. Such regions can have a N-type conductivity or a P-type conductivity, and doping concentrations can vary. Such regions can refer to a plurality of regions, such as first doped regions, second doped regions, first semiconductor regions, second semiconductor regions, etc. The regions can be formed of a polycrystalline silicon on a substrate or as portions of the substrate itself.

"Thin dielectric layer," "tunneling dielectric layer," "dielectric layer," "thin dielectric material" or intervening layer/material refers to a material on a semiconductor region, between a substrate and another semiconductor layer, or between doped or semiconductor regions on or in a substrate. In an embodiment, the thin dielectric layer can be a tunneling oxide or nitride layer of a thickness of approximately 2 nanometers or less. The thin dielectric layer can be referred to as a very thin dielectric layer, through which electrical conduction can be achieved. The conduction can be due to quantum tunneling and/or the presence of small regions of direct physical connection through thin spots in the dielectric layer. Exemplary materials include silicon oxide, silicon dioxide, silicon nitride, and other dielectric materials.

"Intervening layer" or "insulating layer" describes a layer that provides for electrical insulation, passivation, and inhibit light reflectivity. An intervening layer can be several layers, for example a stack of intervening layers. In some contexts, the intervening layer can be interchanged with a tunneling dielectric layer, while in others the intervening layer is a masking layer or an "antireflective coating layer" (ARC layer). Exemplary materials include silicon nitride, silicon oxynitride, silicon oxide (SiOx) silicon dioxide, aluminum oxide, amorphous silicon, polycrystalline silicon, molybdenum oxide, tungsten oxide, indium tin oxide, tin oxide, vanadium oxide, titanium oxide, silicon carbide and other materials and combinations thereof. In an example, the intervening layer can include a material that can act as a moisture barrier. Also, for example, the insulating material can be a passivation layer for a solar cell. In an example the intervening layer can be a dielectric double layer, such as a silicon oxide ($SiO_x$), for example with high hydrogen content, aluminum oxide ($Al_2O_3$) dielectric double layer.

"Locally deposited metal" and "metal deposition" are used to describe forming a metal region by exposing a metal source to a laser that forms and/or deposits metal from the metal source onto portions of a substrate. This process is not limited to any particular theory or mechanism of metal deposition. In an example, locally deposited metal can be formed upon exposure of a metal foil to a laser beam that forms and/or deposits metal from the metal foil, such as all of the metal foil exposed to the laser beam, onto portions of a silicon substrate. This process can be referred to as a "Laser Assisted Metallization Patterning" or LAMP technique. The locally deposited metal can have a thickness of 1 nanometers (nm) to 20 microns (μm), a width approximately defined by the laser beam size, and physical and electrical properties matching those of the source metal foil.

"Patterning" refers to a process of promoting separation or separating portions of a source metal, and can specifically refer to weakening a region of a metal foil that is between a bulk of the metal foil and a deposited region of the metal foil (i.e., the deposited metal). This patterning can be the result of heat, perforation, deformation or other manipulation of the metal foil by the same laser process, LAMP, that deposits a metal foil onto a substrate, and can promote removal of the bulk of the metal foil (i.e., the non-deposited metal foil) from the resulting device. Unless expressed otherwise, references to LAMP includes such patterning.

"Substrate" can refer to, but is not limited to, semiconductor substrates, such as silicon, and specifically such as single crystalline silicon substrates, multi-crystalline silicon substrates, wafers, silicon wafers and other semiconductor substrates used for solar cells. In an example, such substrates can be used in micro-electronic devices, photovoltaic cells or solar cells, diodes, photo-diodes, printed circuit boards, and other devices. These terms are used interchangeably herein.

In addition, certain terminology can also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology can include the words specifically mentioned above, derivatives thereof, and words of similar import.

Stringing and local metallization of semiconductor substrates using a laser beam, and the resulting structures, e.g., micro-electronic devices, semiconductor substrates, solar cells, strings of solar cells, and/or solar cell arrays, are described herein. In the following description, numerous specific details are set forth, such as specific process flow operations, in order to provide a thorough understanding of embodiments of the present disclosure. It will be apparent to one skilled in the art that embodiments of the present disclosure can be practiced without these specific details. In other instances, well-known fabrication techniques, such as emitter region fabrication techniques, are not described in detail in order to not unnecessarily obscure embodiments of the present disclosure. Furthermore, it is to be appreciated that the embodiments shown in the figures are illustrative representations and are not necessarily drawn to scale.

The approaches described herein can be applicable for interdigitated back contact (IBC) solar cells as well as other types of solar cells including continuous emitter back contact solar, front and/or back contact solar cells having a trench architecture, e.g. were the n-type and p-type doped regions are separated by a trench structure thin-film, Heterojunction with Intrinsic Thin layer (HIT) Solar cells, Tunnel Oxide Passivated Contact (TOPCon) Solar Cells, organic and front-contact solar cells, front contact cells having overlapping cell sections, Passivated Emitter and Rear Cell (PERC) solar cells, mono-PERC solar cells, Passivated Emitter with Rear Locally-Diffused (PERL) cells, 3 or 4 terminal tandem cells, laminates and other types of solar cells. The metallization approaches described herein can be applicable for solar cells having a plurality of subcells coupled by metallization structures. In an embodiment, a groove can be located between adjacent sub-cells and a metallization structure can connect the adjacent sub-cells together. In an embodiment, the groove can singulate and physically separate one sub-cell from another, e.g., adjacent, sub-cell. In an embodiment, the metallization structure can physically and electrically connect the sub-cells, where the metallization structure can be located over the groove.

The metallization approaches described herein can also be applied to solar cells and/or solar cell portions which have been singulated and/or physically separated, e.g., diced, partially diced and further separated. In an example, these solar cells and/or solar cell portions can be joined together, either physically and/or electrically, by the metallization structures and processes described herein.

Metallization approaches described herein can also be applicable for micro-electronics, semiconductor devices and other substrates in general, such as light emitting diodes, microelectromechanical systems and others. Embodiments described herein can be distinguished over a laser induced forward transfer (LIFT) process, where a film is deposited on glass and requires subsequent plating or the like to achieve a desired metal thickness.

Strings of solar cells, such as two or more solar cells using a metal foil and LAMP deposition, and fabrication thereof as disclosed herein. Two or more solar cells can be connected using an inexpensive metal foil in a single operation process, which represents a significant cost advantage over competing technologies.

In one an example, two solar cells are electrically connected by locating a metal foil over a back side of a first solar cell, and performing a LAMP technique to the metal foil in one or more locations over the back side of the first solar cell. A metal foil can also be located over a front side of the first solar cell and subsequently subjected to a LAMP technique in one or more locations over the front side of the first solar cell. The LAMP technique forms one or more conductive contact structures electrically connecting the metal foil to the respective front and back sides of the first solar cell. The conductive contact structures include locally deposited metal portions electrically connecting a metal source, e.g., a metal foil, to semiconductor regions of a solar cell.

This first solar cell can be connected to a second solar cell via the metal foil on the front or back sides of the first solar cell, where such metal foil, or portion thereof, is located over a portion of the second solar cell and subjected to a bonding or a LAMP technique to form conductive contact structures between such metal foil and the second solar cell. Exemplary bonding techniques include using an electrically conductive adhesive, welding or soldering. The conductive contact structures include locally deposited metal portions electrically connecting a metal source, e.g., the aforementioned metal foil, to semiconductor regions of a solar cell Depending on the types of solar cells being connect, e.g. front contact or back contact solar cells, the front side of the first solar cell can be connected to a front side of the second solar cell or a back side of the second solar cell. By repeating such a process solar cell strings of almost any length can be formed, for example, by connecting a third, fourth, fifth, etc. solar cell to the first solar cell or the second solar cell. These longer strings can be connected together to form an array of solar cells, for example in series and/or in parallel, such as connected with interconnects and/or busbars. The first and/or second solar cell can include one or more contact pads and the conductive contact structures can electrically connect the metal foil to the one or more contact pads.

Strings of solar cells can also be connected together by stacking the strings together, for example with their front sides facing each other, and bonding (electrically and physically) the metal foil extending from one solar cell at the end of a first solar cell string to a complementary metal foil extending from a solar cell at the end of a second solar string that is stacked over the first solar cell string to form an electrical connection, e.g., using metal foil extending from the ends of the first and second solar cell strings. The bonding can be done by a LAMP technique as described herein, a welding process, such as such as laser welding, induction welding, ultrasonic welding, plasma welding, and resistive welding, or thermocompression bonding. In another example, the bonding is by a conductive adhesive or by crimping of foil extending from one solar cell to foil extending from another solar cell.

A locating process can be performed to position or secure metal foil to a substrate, for example, using a vacuum and/or a tacking process to hold the metal foil in place over/on the substrate. The locating process can include thermocompression, where a roller and/or heat can be used to position or locate the metal foil over the substrate. A vacuum process, thermocompression process or other similar process can also be used to uniformly position the metal foil and inhibit air gaps or air pockets between the metal foil and the substrate.

An insulating material can be used to electrically separate portions of the foil from either the first and/or second solar cell, such as selected sides or edges of the first and/or second solar cells. In an example, an insulating material is located over at least a portion of the back side of the metal foil (e.g. the side of the metal foil facing away from the back side of the first solar cell). In another example, an insulating material can be located over at least a portion of the front side of the metal foil (e.g. the side of the metal foil facing toward the back side of the first solar cell). The location of this insulating material can be chosen such that when the two solar cells are connected and or installed the insulating material inhibits shorting between solar cells and the metal foil. The insulating material can be applied prior to or after a LAMP technique, and can cover an entirety of the bulk metal foil or selectively patterned to provide selective insulation.

The insulating material can be any non-conductive material, such as, a non-conductive tape or other suitable non-conductive shield or cover and can serve to hide the metal foil when viewed from above. The non-conductive shield can cover exposed sections of the metal foil between solar cells. In an example, the non-conductive shield can cover portions that would have been visible in the final product, such as a solar cell laminate, module panel, etc. Therefore, the insulating material can include a material that is substantially opaque to sufficiently cloak the metal foil when viewed from the front. The insulating material can also assist in alignment of the solar cells, and/or holding the solar cells together. Examples, of insulating materials include polypropylene or polyethylene, which can further include an adhesive layer like an acrylate. An encapsulant material can also serve as an insulating material. An exemplary encapsulant includes one of the same material used to form a solar module from the solar cells described herein, including but not limited to polyolefin, EVA, PVA and PVB encapsulants.

Although an insulating material can be beneficial for the reasons explained above, other embodiments may not include an insulating material. In some embodiments, the metal foil between the solar cells provides for self-shingling solar cell strings. These designs can facilitate packaging, unpackaging, assembling, connecting, installing, and maintaining solar cell modules. These modules can comprise a single array of solar cell cells as well as a plurality of solar cell arrays. The inclusion of the insulating material can facilitate the shingling as solar cells are overlapped with adjacent solar cells for example, to prevent shorting between the solar cells and the metal foil.

In an embodiment the metal foil that resides between the first solar cell and the second solar cell is folded or bent, for example, to facilitate connecting the foil to the back side of one solar cell and the front side of another solar cell. The bending can be done prior to connection of the solar cells or after. In addition, the connection of the first and second solar cell to the metal foil can be done in any order, or even substantially concurrent. For example, the back side of the first solar cell can be connected to metal foil before the front side or back side of the second solar cell is connected to the metal foil. Conversely, the back side of the first solar cell can be connected to metal foil after the front side or back side of the second solar cell is connected to the metal foil.

In an example, the power, wavelength and/or pulse duration of a laser for a LAMP technique are selected so as to form a plurality of locally deposited metal portions, but not to fully ablate the foil. The power, wavelength and/or pulse duration can be selected/tuned based on the metal foil composition, melting temperature and/or thickness. In an example, the laser has a wavelength of between about 250 nm and about 2000 nm (such as wavelength of 250 nanometers to 300 nanometers, 275 nanometers to 400 nanometers, 300 nanometers to 500 nanometers, 400 nanometers to 750 nanometers, 500 nanometers to 1000 nanometers, 750 nanometers to 1500 nanometers, or 1000 nanometers to 2000 nanometers), the laser peak power is above $5 \times 10^{+4}$ W/mm$^2$, and the laser is a pulse laser with a pulse frequency of about 1 kHz and about 10 MHz (such as about 1 kHz and about 10 MHz, such a 1 kHz to 1000 kHz, 500 kHz to 2000 kHz, 1000 kHz to 5000 kHz, 2000 kHz to 7500 kHz, or 5000 kHz to 10 mHz. The pulse duration can be between 1 fs to 1 ms, such as 1 fs to 250 fs, 100 fs to 500 fs, 250 fs to 750 fs, 500 fs to 1 ns, 750 fs to 100 ns, 1 ns to 250 ns, 100 ns to 500 ns, 250 ns to 750 ns, 500 ns to 1000 ns, 750 ns to 1500 ns, 1000 ns to 5000 ns, 1500 ns to 10000 ns, 5000 ns to 100000 ns, 10000 ns to 500000 ns, and 100000 to 1 ms. The laser can be an IR, Green or a UV laser. In certain examples, the laser beam has a width of between about 20 and about 50 μm, such as 20-30 μm, 25-40 μm, and 30-50 μm.

In one embodiment, a method of fabricating a solar cell string includes forming semiconductor regions in or above a substrate. In another embodiment, the substrate is provided with semiconductor regions in or above the substrate. An intervening layer can be formed on the semiconductor regions, the intervening layer having openings exposing portions of the semiconductor regions. A metal foil can be located over the intervening layer and exposed to a laser beam in locations over, partially over, offset from or adjacent to the openings in the intervening layer. Exposing the metal foil to the laser beam forms a plurality of conductive contact structures electrically connected to the semiconductor regions, each conductive contact structure including a locally deposited metal portion. In embodiments, the method can include laser sputtering the metal foil in locations over the openings in the intervening layer. The laser sputtering can form a plurality of conductive contact structures electrically connected to the semiconductor regions.

Not to be bound by theory, the above described localized metal deposition achieved by exposing a metal foil to a laser beam can be achieved by partial or full melt of the laser irradiated portions of the metal foil, by partial or full ablation of portions of the metal foil with subsequent re-deposition onto the wafer surface, and/or by laser sputtering of portions of a metal foil during a laser deposition and patterning process of the metal foil. In an example, first portions of the metal foil are exposed to a laser beam and subsequently deposited on the wafer surface, while patterning the source metal foil layer at the same time. Additionally, certain implementations result in these first portions of the metal foil being fully or at least partially connected to adjacent second portions of the metal foil that have not been exposed to laser irradiation. A region of the metal foil between the first and second portions can have a relatively weakened physical structure (as compared to the second portions) that promotes separation of the second portions from the first portions to create discrete conductive paths.

Conventional metal deposition and patterning of a metal layer for a solar cell can include using a vacuum chamber for metal deposition or a chemical bath for metal plating. One or more patterning operations is also typically performed to identify regions where a deposited metal needs to be removed. In contrast, the disclosed metallization approaches effectively achieve metal deposition and patterning in a single process operation, eliminating or eliminating the need for previously required processes. However, a LAMP technique can be used in addition to (e.g., after) conventional metal deposition.

Several implementations discussed herein can provide less costly and faster metallization than using optical lithography (and omission of an associated etch process), and potentially more precise patterning with smaller feature width and higher aspect ratio compared to screen printing. LAMP techniques enable direct deposition and patterning of metal on a substrate using an inexpensive metal foil in a single operation process via a laser, and represents a significant cost advantage over competing technologies. LAMP techniques also enable the fabrication of relatively small features. Specifically, tighter pitch and higher efficiency can be achieved as compared with structures typically formed using screen printing. In an example, screen printed conductive contacts can include silver paste having a thickness of up to 50 microns and a minimum feature size of 50 microns. In contrast, LAMP techniques can result in a thickness of approximately 1 nanometers to 20 microns and a minimum feature size of approximately 25 microns. The deposition thickness can be controlled by the starting thickness of the source material and the laser conditions. The deposited thickness can range from about 5% to about 25% of the source material thickness. The thickness of the source material partially constrains the laser conditions (in particular, the pulse duration) required for LAMP. The thickness of the source material partially constrains the laser conditions (in particular, the pulse duration) required for LAMP. In one embodiment, a metal source material can have a thickness in a range of approximately 1 nm to 1 μm. In an example, performing laser assisted metallization process (LAMP) can include sputtering metal from a thin source material onto a thin polymer or membrane using a picosecond laser or a femtosecond laser, where the thin source material can have a thickness in a range of approximately 1 nm to 1 μm. In an embodiment, the metal source material can have a thickness in a range of 1 μm to 100 μm, such as 1 μm to 10 μm, 5 μm to 25 μm, 10 μm to 50 μm, 25 μm to 75 μm, or 50 μm to 100 μm. In an example, performing laser assisted metallization process (LAMP) can include sputtering metal from a metal foil onto a substrate using a picosecond laser or a femtosecond laser, where the metal foil can have a thickness in a range of approximately 1 μm to 100 μm. In various implementations of the LAMP techniques disclose parameters for pre- and post-LAMP metal thickness are as described in Table 1.

TABLE 1

| | Pre-LAMP Foil Thickness | Post-LAMP Foil Thickness: Single Foil | Post-Processing Foil Thickness: One layer of a Foil Stack | Post-Processing Foil Thickness: Total of all layers of a Foil Stack (a LAMP layer and additionally bonded layers) |
|---|---|---|---|---|
| Target Thickness Examples | 10-50 μm | 1-10 μm in LAMP region 1-20 μm in LAMP region 10-50 μm or original thickness in non-LAMP region | 1-10 μm for initial LAMP layer 1-20 μm for initial LAMP layer 10-50 μm for additionally bonded layers 20-200 μm for additionally bonded layers | 10-50 μm 25-45 μm 25-200 μm 10-220 μm |
| Practical Minimum Thickness Examples | 1 μm | 60 nm 100 nm | 100 nm 1 μm | 100 nm |
| Practical Maximum Thickness Examples | 100 μm | 12 μm 20 μm | 20 μm 200 μm | N/A |

Other advantages include providing a feasible approach to replace the use of silver with less costly aluminum (in the form of an aluminum foil) for metallization of semiconductor features. Furthermore, the aluminum deposited with a LAMP technique can be a pure, monolithic metal, in contrast to screen printed silver, which has higher electrical resistance due to its porosity. In addition to the examples of Table 1, in various examples utilizing aluminum as a metal foil, the solar cell can have a layer (or layers) of aluminum with a thickness of approximately 1 nm-500 μm. The metal foil can include aluminum in an amount greater than approximately 97% and silicon in an amount approximately in the range of 0-2%.

An exemplary aluminum (Al) metal foil has a thickness approximately in the range of 1-100 μm, for example in the range of 1-15 μm, 5-30 μm, 15-40 μm, 25-50 μm 30-75 μm, or 50-100 μm. The Al metal foil can be a temper grade metal foil such as, but not limited to, F-grade (as fabricated), O-grade (full soft), H-grade (strain hardened) or T-grade (heat treated). The aluminum metal foil can be anodized or not, and can include one or more coatings. Multilayer metal foils can also be used. Exemplary metal foils include metal foils of aluminum, copper, tin, tungsten, manganese, silicon, magnesium, zinc, lithium and combinations thereof with or without aluminum in stacked layers or as alloys.

In another example, an operation to form metal and pattern a metal layer for a semiconductor device (e.g., a solar cell) can include first forming a first metal layer on a substrate (e.g., a metal seed layer) via conventional or LAMP techniques, locating a second metal layer (such as an aluminum foil) over the first metal layer, and bonding portions of the first metal layer to the second metal layer, e.g., using a laser. The metal seed layer can include a layer of deposited tin, tungsten, titanium, copper, and/or aluminum. A sputtering process can be used to deposit the metal seed layer. The metal seed layer can have a thickness in a range of 0.05 to 50 microns.

Solar cells can include a patterned backsheet, encapsulant and/or colored (pigmented) back encapsulants. The metal foil can be hidden using a masking or cloaking material, such as a tape, that is placed between an edge of the solar cell and the metal foil, in a gap region between adjacent solar cells (spanning the gap therebetween). The metal foil can also be anodized or otherwise colored to match the solar cell so that it is not readily visible or distinguishable from the solar cell when viewed from the front (i.e., the metal foil is masked or cloaked). The metal foil can also include an adhesive, for example, to adhere the metal foil to the substrate for pre-LAMP processing and/or post-LAMP processing. Alternatively or in addition to, the substrate includes an adhesive to secure the metal foil pre-LAMP processing and/or post-LAMP processing. A dielectric material, for example, a damage buffer material (DBM), or oxide material can also be disposed between the substrate and the metal foil.

After the deposition and patterning process as described above, remnants of the source of the metal layer can be removed in a subsequent process. For example, portions of a metal foil that are not exposed to the laser beam are removed (i.e., non-deposited metal foil is removed). In one such embodiment, removing at least a portion of the metal foil not exposed to the laser beam can include removing all portions of the metal foil not exposed to the laser beam. In a further example, portions of the metal foil are exposed to a subsequently applied laser beam, such as another laser beam and/or exposed to a laser having different properties (e.g., power, frequency, etc.). This subsequent processing can provide further patterning of the metal foil for purposes of removing the non-deposited metal foil. In certain implementations, a LAMP technique is repeated on a substrate in successive steps to form a metal layer on the substrate. In particular, a first foil is subjected to a first LAMP technique to form first conductive contact structures on first portions or regions of the substrate, and a second foil is subjected to a second LAMP technique on second portions or regions of the substrate. This second LAMP technique can occur after portions of the first foil that were not subjected to the first LAMP technique are removed, and the second portions or regions can be located on regions of the substrate where theses portions of the first foil were removed. Likewise, portions of the second foil that were not subjected to the second LAMP technique can be removed, and similar third, fourth, etc. LAMP techniques can be performed successively to form the metal layer on the substrate. This implementation can be used in an example where the to-be-removed portions of foil are difficult to remove due to shape or proximity to other features, such as metal features, on the substrate.

In an example, non-locally deposited portions of the metal foil are removed, which can result in the locally deposited portions of the metal foil having an edge feature, such as an edge feature formed by physically separating, breaking or tearing the bulk metal foil that was not subjected to a LAMP technique, from the portions of the metal foil that are deposited on the substrate. The edge feature can include a torn edge or a sharp torn edge. In an example, first portions of the metal (aluminum foil in this example) are deposited or directly secured to the surface of the solar cell by a LAMP technique, whereas second portions (which are adjacent to the first portions) of the metal are not subjected to a LAMP technique and are not deposited or directly secured to the surface of the solar cell. The first and second portions of the metal foil are attached to each other, and a region therebetween can be patterned to weaken this region, preferably the same LAMP technique in a same process step that deposited the first portions. The second portions are removed and physically separated or torn away from the first portions, resulting in an edge structure along sides of the first portions. This edge structure or feature can be sharp and/or torn in appearance, and is differentiated from a round or curved edge of a metallization feature left behind from welding, soldering, plating or other depositions of metal to a substrate. The edge structures can also be polished to remove sharp or rough features in a subsequent step.

Exposing foil to a laser beam can also form other features that are unique when compared to conventional metallization approaches, including forming a "U-shaped" structure or valley where the laser beam has contacted the foil. The width of the "U-shaped" is approximately equal to the width of the laser beam used. In an embodiment, the conductive contact structures are connected, at least temporarily until the removal of the regions not exposed to the laser beam, by edge portions that extend from the conductive contact structure to regions of the metal foil not exposed to the laser beam In an example, exposing the metal foil to the laser beam forms a spatter or sputter feature on the solar cell, for example on the foil and/or substrate. Such a spatter feature can be used to determine if the solar cell was formed using a LAMP technique. In some examples, the spatter feature can be removed from at least the metal foil, for example, to facilitate bonding of a second material to the foil, such as a carrier sheet used to remove the foil that has not been exposed to the laser beam, or other components of a solar cell, solar cell string, or higher order structure, such as an interconnect, foil extending from another cell, or other electrically or non-electrically connected component of a solar cell, solar cell string, or higher order structure. Such spatter can be removed by polishing or etching.

Laser assisted metallization can be repeated to build up a multi-layer metal foil structure for purposes of increases metal thickness (e.g., for conductivity or structural purposes) and to facilitate removal of non-deposited portions of a first metal foil layer. Specifically, a second metal source, such as a metal foil, wire, or tape can be located over a first metal foil, where the second metal source is subjected to a laser beam in selected locations over positions of the first metal foil that are not locally deposited (i.e., directly electrically connected) to semiconductor regions, thereby welding or bonding the second metal source to the first metal foil. Subsequent mechanical removal of the second metal source thereby selectively removes regions of the first metal foil that are not locally deposited to semiconductor regions on the substrate.

Additionally, the second metal source is used to provide additional metallization thickness to an entire or portions of a solar cell, such as for the construction of busbars where additional metal thickness is beneficial for electric conduction. Here, the second metal source can be bonded to the first metal foil, via a laser, at the selected locations over positions of the first metal foil that are not locally deposited and/or the same or approximately the same positions that the first metal foil is locally deposited to the semiconductor regions. This process can be restricted to interconnection regions between adjacent solar cells or applies across a string of adjacent solar cells.

Additionally, the second metal source is located over the solar cell substrate which includes regions or portion of localized metallization, such as formed from a first metal foil or by conventional metallization techniques. The second metal source is bonded to the localized metallization in selected regions to provide additional metallization in these selected regions. In an example, the second metal source is patterned to both increase metal thickness in some regions and to be used as a carrier sheet to remove non-locally deposited portions of the first metal foil in other regions. A tacking process can be used to bond a second metal source to a first metal foil. A tacking process involves forming an array of point or spot welds, which can be performed using a laser, thermocompression bonding (e.g., by using spikes, a spiked roller, a porcupine roller, or a bed of nails), or conventional soldering and welding techniques. The second metal source can also be bonded to the first foil using an electrically conductive adhesive. In another embodiment, the carrier is a plastic, polymer, and/or membrane, that can be used as an insulator, moisture barrier, protection layer and the like.

In an embodiment, the substrate can have a plurality of doped regions. In an embodiment, the plurality of doped regions can be referred to as a first doped region, a second doped region, etc. In an example, the first doped region can include an N-type semiconductor region and the second doped region can include a P-type semiconductor region. In an example, the substrate can include a plurality of N-type and P-type semiconductor regions. In some embodiments, the N-type and P-type semiconductor regions can be alternating N-type and P-type semiconductor regions. In an embodiment, the alternating N-type and P-type semiconductor regions can be placed one after another or occurring repeatedly, e.g., as interdigitated fingers.

In embodiments, methods described herein can include forming a plurality of N-type and P-type semiconductor regions in or above a substrate. Also, in an example, a method of fabricating a solar cell can include forming a plurality of N-type or P-type semiconductor regions in or above one side of the substrate. In an embodiment, the method can include placing N-type and P-type semiconductor regions on the front side, the back side of the substrate or on both.

Disclosed herein are strings of solar cells, for example strings of two or more solar cells. The solar cells can include doped regions, such as, doped regions disposed in, above over the substrate, or a combination thereof. In an embodiment, the doped regions can have a N-type conductivity type or a P-type conductivity type. In an embodiment, the doped regions can be located on the front side, the back side of the substrate or a combination thereof.

In an embodiment a metal foil is disposed over a back side, a font side, or both a backside and front side of each of the plurality of solar cells. This metal foil extends to between the solar cells, effectively spanning the gap or space between the solar cells. In an example, the back side of one solar cell is electrically joined to the front side of another solar cell with a metal foil. In an example, the back side of one solar cell and the back side of another solar cell with a metal foil. In an example, the front side of one solar cell and the front side of another solar cell with a metal foil. In an embodiment, the solar cell string includes one or more laser assisted metallization conductive contact structures electrically connecting the metal foil to the solar cells. In an embodiment, each conductive contact structure includes a locally deposited metal portion.

The solar cells can include contact pads to facilitate the connection of the laser assisted metallization conductive contact structures electrically connect the metal foil, one or more additional solar cells, busbars, and/or solar cell interconnects. In an embodiment, the solar cell string includes a third, fourth, fifth, etc. solar cell connected to the first and/or second solar cell. In an embodiment, the metal foil is folded or bent between the first solar cell and the second solar cell. The folded or bent metal foil can act as a stress relief feature.

The solar cell strings can include an insulating material as described above can be used to electrically separate portions of the foil from either the first and/or second solar cell, such as selected sides or edges of the first and/or second solar cells.

In an embodiment, the metal foil can include different pattern configurations. For example, the metal foil can extend between the first and second solar cells and can include stress relief features. In other examples, the metal foil can include information, such as a 2D bar code for solar cell and/or string level tracking, alignment, etc. In one embodiment, the metal foil can include patterns, such as an interdigitated pattern, a fishbone pattern, etc. In one embodiment, the metal foil can include textures, such as corrugation or a pre-texture for uni-directional strength.

In an embodiment, the metal foil includes laser metallization artifacts, such as described above, for example edge features and/or spatter features.

As an example of solar cell string, FIGS. 1A-1F illustrate side views of operations in a method of fabricating a solar cell string. As will be apparent, the fabrication of a solar cell string can be expanded to a multi-solar cell string (see, for example, FIGS. 5, 9, and 10A-13 and 18-19B). In addition, it is contemplated the multi-solar cell string(s) can be further coupled together to form solar cell arrays, for example, by attachment of a busbar or other interconnect at the end of the string, either in a parallel and/or serial arrangement.

Referring to FIG. 1A, a solar cell 125 is provided. The solar cell 125 can be any size or configuration. The solar cell 125 includes a plurality of conductive contact structures 110 electrically connected to the plurality of semiconductor regions in or above the substrate 100. The conductive contact structures 110 can be formed conventionally or using a laser deposition process of a metal foil as disclosed herein and as exemplified by FIGS. 14A-14D. Further provided is a metal such as metal foil 120. The solar cell 125 can be a front contact and/or a back contact (e.g., interdigitated back contact) solar cell. In an example, for a back contact solar cell, the conductive contact structures 110 need not be formed.

Figure 1B:
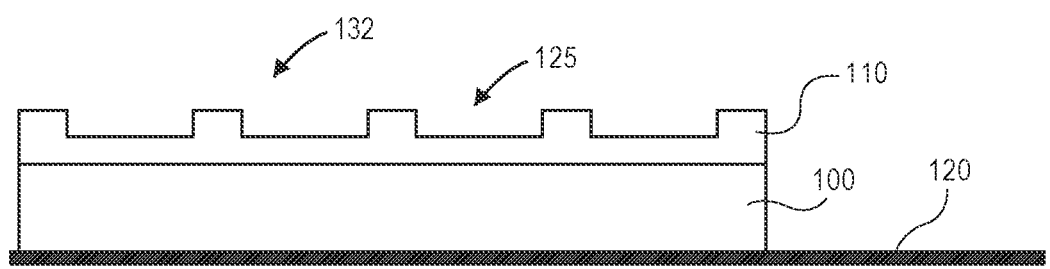
Figure 1C:
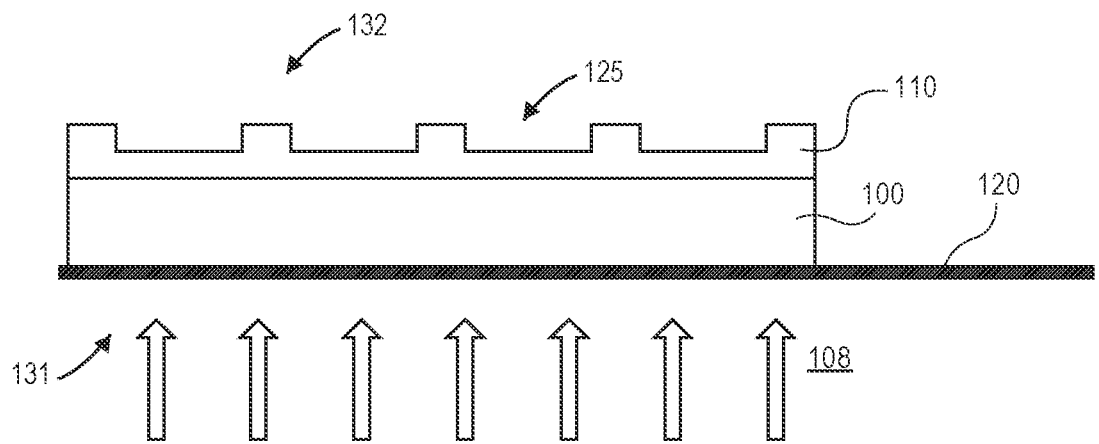

Referring to FIG. 1B, the metal foil 120 is located over the back side 131 of the solar cell 125 and, as shown FIG. 1C, the metal foil 120 is exposed to a laser beam 108 of a LAMP technique in locations over the back side 131 of the solar cell 125. Exposing the metal foil 120 to the laser beam 108 forms a plurality of conductive contact structures electrically connected to the back side 131 of the substrate 100. The conductive contact structures electrically connect regions of the substrate 100 to the metal foil 120, allowing for the flow of electrons from the substrate 100 to the metal foil 120. The conductive contact structures can be uniformly distributed, in a pattern, random or otherwise distributed on the back side 131 of the substrate 100. The metal foil 120 can conduct electricity to or from the substrate 100 depending on the polarity of the connection. The metal foil 120 is an exemplary source of metal and is referred to as a local source since the metal foil 120 is first placed on a substrate surface, and then exposed to a laser process, i.e. a LAMP technique, to deposit metal from the metal foil 120 (metal source) onto portions of the substrate 100.

Portions of the metal foil are fully or at least partially connected to adjacent portions of the metal foil that have not been subject to laser irradiation. In addition to creating an electrical connection between the metal foil 120 and the substrate 100 in a vertical direction, the metal foil can provide bulk conductivity across the entirety of a horizontal plane across the back side of the substrate 100, providing a continuously conductive surface on the back side of the substrate 100. Also, the metal foil 120 can be used for localized metal deposition and/or patterning, as similarly described with reference to FIGS. 14A-14D, and portions of the metal foil 120 can be removed (e.g., if the back side of the substrate 100 is used to collect light as in the case of a bifacial solar cell). A solar cell 125 that includes the electrically attached metal foil 120 can be used for further fabrication of solar cell strings, where a portion of the metal foil 120 extends past an edge of the substrate 100.

Figure 1D:
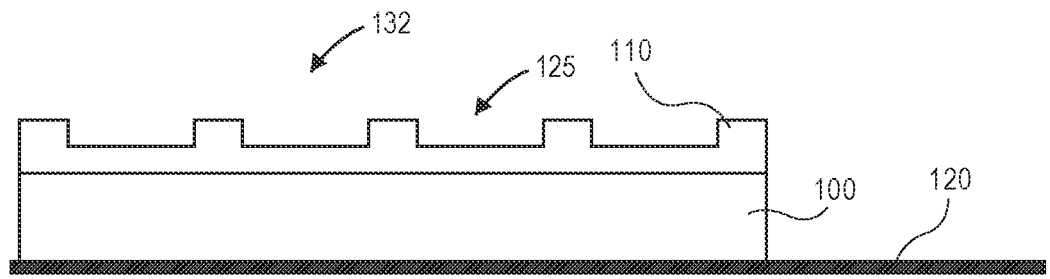

Referring to FIG. 1D, the metal foil 120 is electrically connected to the back side 131 of the substrate 100, the metal foil 120 can be manipulated, such as bent or folded, so that the end of the metal foil 120 protruding from the end of the solar cell 125 can be located over a metalized portion of the front side 132 of an adjacent solar cell. The metal foil 120 can be a continuous sheet or a series of strips in the form of ribbons.

Figure 1E:
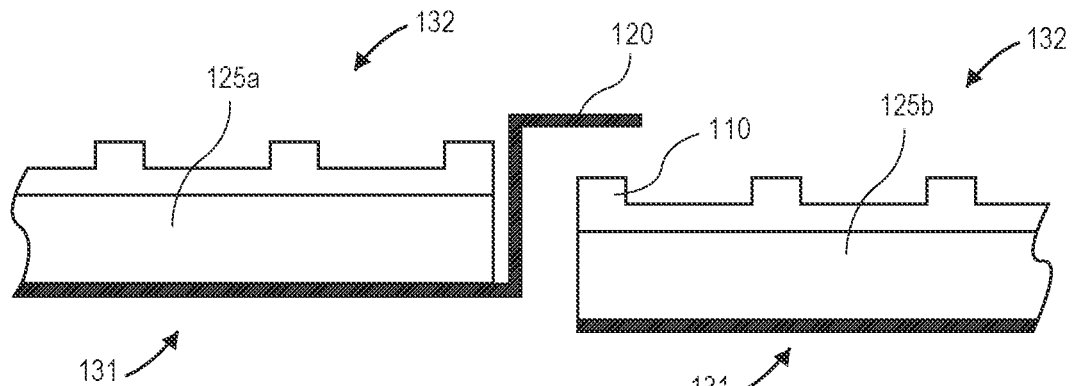
Figure 5:
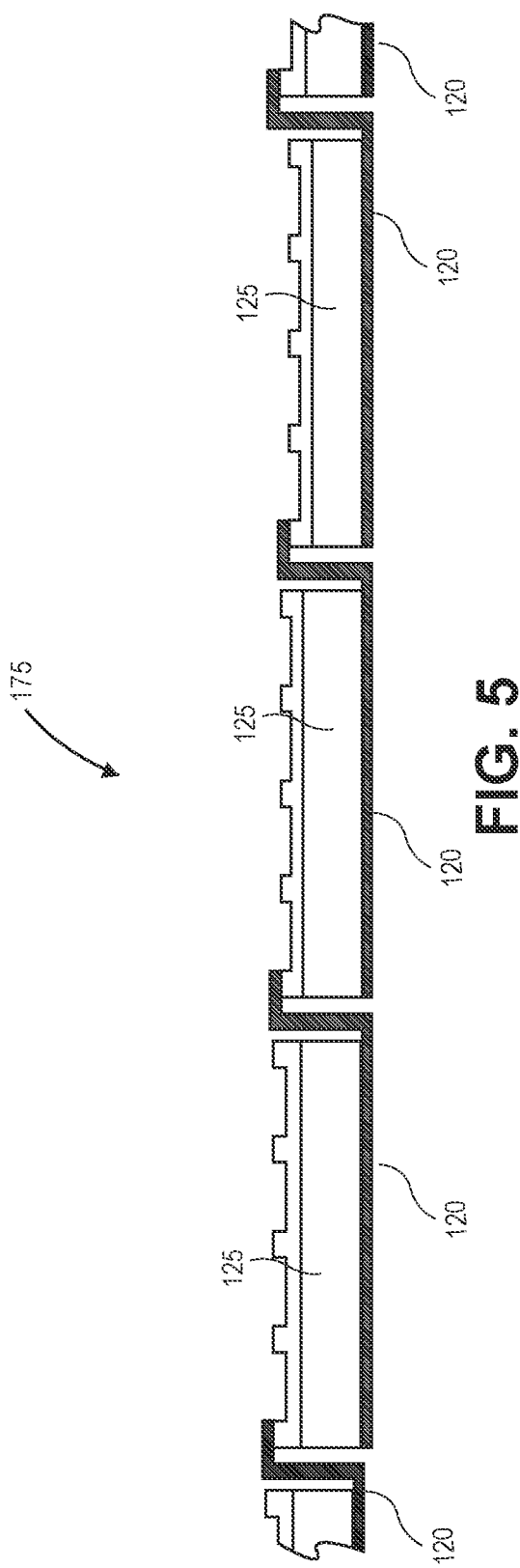
FIG. 5 illustrates a side view of a multi-solar cell string.

Referring to FIG. 1E, two (or more, as shown in FIG. 5) solar cells are located adjacent to each other such the metal foil 120 protruding from the first or left solar cell 125a extends over a metalized portion of the second or right solar cell 125b. The metal foil 120 extends from left to right in a length sufficient for electrical conduction between the solar cells 125a and 125b and can be minimized in this respect. In another implementation, the metal foil 120 extends from left to right in a length sufficient to cover the entirety of the front side 132 of the solar cell 125b. Thus, the same piece of the metal foil 120 can be used to form conductive contact structures on both the back side 131 of the solar cell 125a and the front side 132 of the solar cell 125b, which can be accomplished in a single or successive application of LAMP, and which can include patterning and removal of non-locally deposited metal from the back side 131 and/or the front side 132.

Figure 1F:
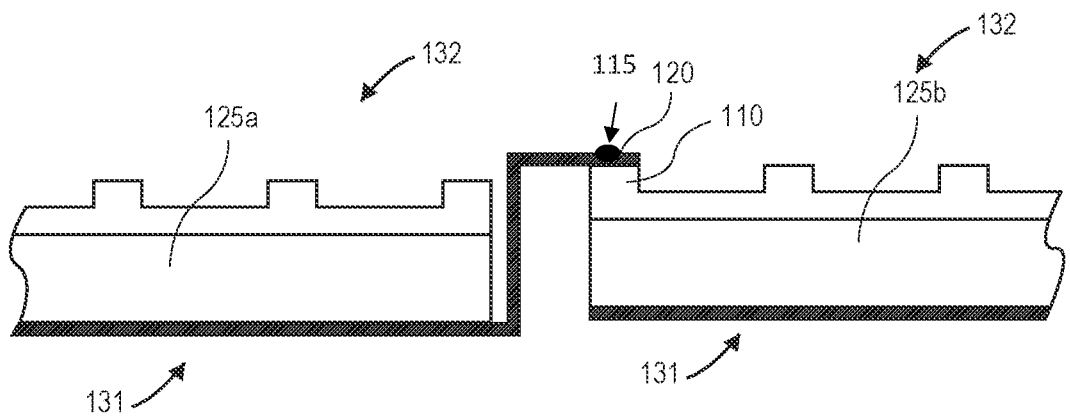

Referring to FIG. 1F, an electrically conductive bond 115 is formed in locations over the conductive contact structures 110 the solar cell 125b to electrically connect the metal foil 120 to the conductive contact structures 110 of the solar cell 125b. The electrically conductive bond 115 electrically connects conductive contact structures 110 to the metal foil 120, allowing for the flow of electrons. The electrically conductive bond(s) 115 can be uniformly distributed, in a pattern, random or otherwise distributed on the metal foil 120. The metal foil 120 can be exposed to a laser beam to form a plurality of conductive contact structures electrically connecting the metal foil 120 to the conductive contact structures 110 of solar cell 125b, which can result in a welded or other electrically bonded structure. Alternatively, other bonding mechanisms can be uses to connect the metal foil 120 to existing conductive contact structures 110. The methods and structures shown in FIGS. 1A-1F can be repeated to form a solar cell string from a plurality of the solar cells 125, such as shown in FIG. 5.

The process steps shown in FIGS. 1A-1F can be performed in a single operation or in a different order than what is shown. Other steps can also be performed such as performing the process shown in FIG. 1C but soldering, welding or adhering by an adhesive 120 over 125 in process shown in FIG. 1F. In an example, a bonding process can be performed to bond the metal foil 120 to the conductive contact structures 110 of solar sell 125b. In a further example, the bonding process can include a laser process as described herein. Bonding can include welding process, such as described above. Bonding can also be thermocompression bonding, soldering or the use of an electrically conductive adhesive. Further, multiple solar cell strings can be coupled together to form solar cell arrays, for example by attachment of the busbar at the end of the string, either in a parallel and/or serial arrangement. With reference to again to FIGS. 1A-1F, the process described can be repeated with successive foils to form conductive contact structures on different portions of the substrate, such as a second, third, etc. portions or regions of the substrate, each of which is a discrete region on the substrate.

Figure 2:
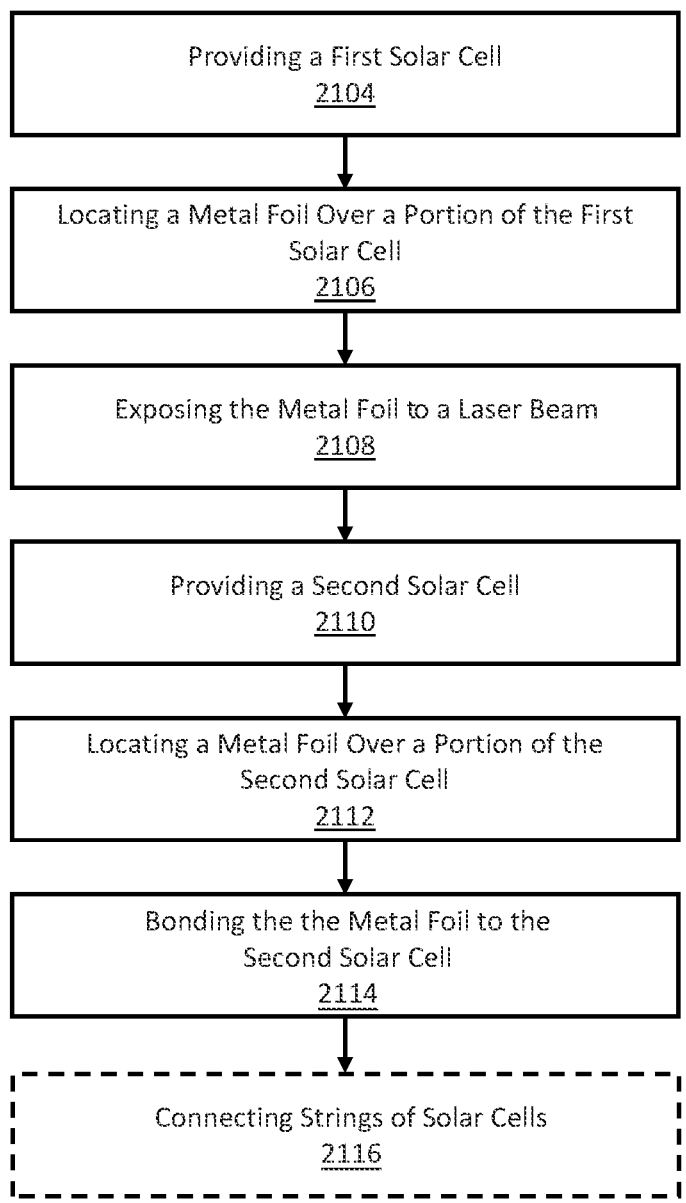
FIG. 2 illustrates an exemplary work flow for constructing a solar cell.

FIG. 2 is a flowchart 2100 representing various operations in a method of fabricating a solar cell, in accordance with an embodiment of the present disclosure. At operation 2104, the method includes providing a first solar cell. At operation 2106, the method includes locating a metal foil over a portion of the of the first solar cell. At operation 2108, the method includes exposing the metal foil to a laser beam, wherein exposing the metal foil to the laser beam forms a plurality of conductive contact structures electrically connected to the first solar cell. At operation 2110, the method includes providing a second solar cell. At operation 2112, the method includes locating a metal foil over a portion of the of the second solar cell. At operation 2114, the method can include bonding the metal foil to the second solar cell. In an embodiment, at operation 2114, the bonding can include exposing the metal foil to a laser beam, wherein exposing the metal foil to the laser beam forms a plurality of conductive contact structures electrically connected to the second solar cell. In an embodiment, the bonding can include a welding process, such as laser welding or induction welding. In embodiment, the bonding performed by a thermocompression bonding process. In an embodiment, the bonding is accomplished with a conductive adhesive. At optional operation 2116, the method can include connecting strings of solar cells, for example at the ends of the strings with foil extending from the substrate, a busbar and/or a threaded metal foil ribbon, which in some examples is a subjected to the LAMP technique described herein. In other examples, the foil of respective strings of solar cells can be bonded together, for example, by welding, soldering, thermocompression or with an electrically conductive adhesive. Optionally or in addition to, the method includes removing at least a portion of the metal foil not exposed to the laser beam. Optionally or in addition to, the method includes removing a spatter feature from the metal foil not exposed to the laser beam. Optionally or in addition to, the method includes forming a plurality of semiconductor region in or above the substrate. The operations described above can be repeated, for example with successive foils.

Figure 3A:
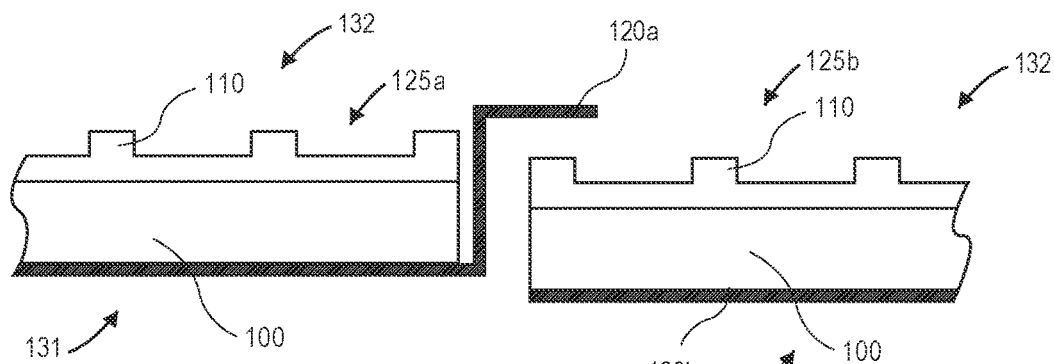
FIGS. 3A and 3B illustrate side views of operations in a method of fabricating a solar cell string.
Figure 3B:
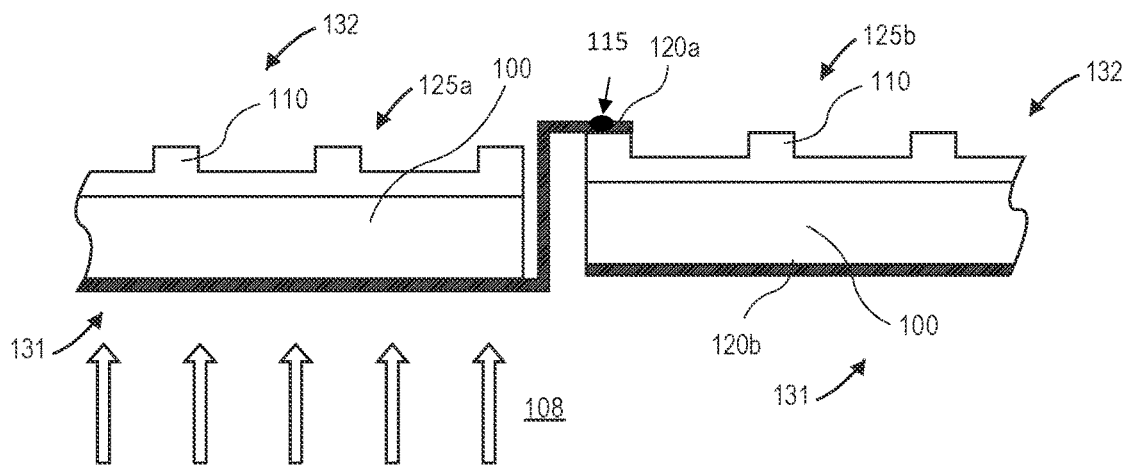

As another example, FIGS. 3A-3B illustrate side views of fabricating a solar cell string.

Referring to FIG. 3A, a solar cell 125a is provided. The solar cell 125a can be any size or configuration that does not or does not necessarily include back side metallization. In an embodiment, the solar cell 125a is one produced by the methods described herein (e.g., a LAMP technique) and as exemplified by FIGS. 14A-14D. The solar cell 125a includes a plurality of conductive contact structures 110 electrically connected to the plurality of semiconductor regions in or above the substrate 100. In an embodiment, the semiconductor regions can include N-type and/or P-type semiconductor regions in or above the substrate 100. The conductive contact structures 110 can be formed conventional or using a laser deposition process of a metal foil as disclosed herein. As differentiated from the example shown in FIGS. 1A-1F, in this example, the second solar cell 125b is also provided prior to connecting a metal foil to the first solar cell 125a. Thus, further provided is a first metal foil 120a. The metal foil 120a can be pre-folded as shown in FIG. 3A or it can be unfolded. The foil 120a can be adhered to the first solar cell 125a via a vacuum, thermally, etc. An alignment method can be used to align 120a to 125b. Likewise. a second metal foil 120b can be provided and can be adhered to the second solar cell 125b via a vacuum, thermally, etc.

Referring to FIG. 3B the metal foil 120a can be located over the back side 131 of the solar cell 125a and over an edge portion of the front side 132 of the second adjacent solar cell 125b. The two solar cells 125a and 125b can be located adjacent to each other such that the metal foil 120a is under the substrate 100 of the first solar cell 125a and extends over a metalized portion of the solar cell 125b (e.g., as shown) or, alternatively, directly on the solar cell 125b. An electrically conductive bond 115 is formed in locations over the conductive contact structures 110 the solar cell 125b to electrically connect the metal foil 120a to the conductive contact structures 110 of the solar cell 125b. The electrically conductive bond 115 electrically connects conductive contact structures 110 to the metal foil 120a, allowing for the flow of electrons. The electrically conductive bond(s) 115 can be uniformly distributed, patterned or otherwise distributed on the metal foil 120a. In an embodiment, the metal foil 120a is exposed to a laser beam at 108 to form a plurality of conductive contact structures electrically connecting the metal foil 120a to the conductive contact structures 110 of solar cell 125b. The conductive contact structures electrically connect conductive contact structures 110 to the metal foil 120a, allowing for the flow of electrons. The conductive contact structures can be uniformly distributed, in a pattern, random or otherwise distributed on the metal foil 120a.

In an exemplary implementation, solar cells 125a and 125b are provided with conventional metallization patterns (such as metal ink, metal paste and wires or aluminum, silver, copper, etc.) as a front electrode on the front side 132, and with no back electrode on the back side 131. In this example, the metal foil (e.g., the metal foil 120b for the solar cell 125b) serves as the back electrode for the solar cells 125a and 125b without any intervening metal structures between the metal foil and the semiconductor region(s) on the back side 131 of the solar cells 125a and 125b. The metal foil 120a can conduct electricity to or from the solar cell 125b depending on the polarity of the connection. Also, different procedures and steps can be performed to form the solar cell strings shown. For example, alignment methods, either automated or manual, can be used to locate one solar cell adjacent to another solar cell. Also, in on example, steps to perform the laser deposition process on the front sides, back sides or both the front and back sides of the plurality of solar cells. Although as shown, the solar cell in the string of solar cells can be connected in series, the solar cells in the solar cell string can also be connected in parallel or both in series and in parallel.

Figure 4:
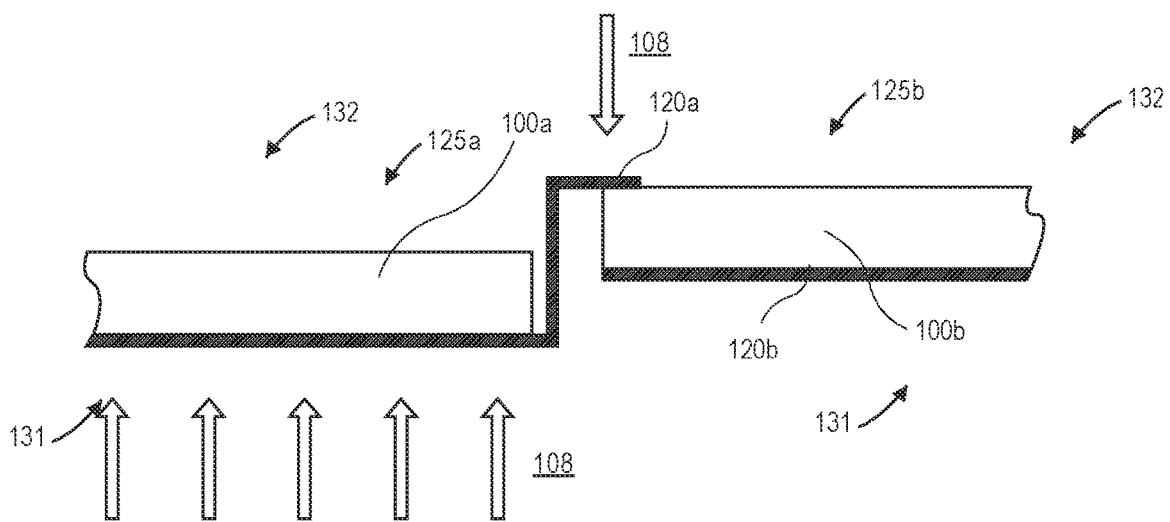
FIG. 4 illustrates a side view of operations in a method of fabricating a solar cell string.

As another example, FIG. 4 illustrates a side view of fabricating a solar cell string. A solar cell 125a is provided that does not include a plurality of conductive contact structures electrically connected to the plurality of semiconductor regions in or above the substrate 100a. A second solar cell 125b is also provided that does not include a plurality of conductive contact structures electrically connected to the plurality of semiconductor regions in or above the substrate 100b. A first metal foil 120a is provided, and can be pre-folded as shown in FIG. 4 or it can be provided in an unfolded orientation and folded subsequent to positioning the second solar cell 125b.

The foil 120a can be located to the first solar cell 125a via a vacuum, thermally, etc. An alignment method can be used to align 120a to 125b. Likewise, a second metal foil 120b can be provided and can be located to the second solar cell 125b via a vacuum, thermally, etc. The metal foil 120a can be located over the back side 131 of the solar cell 125a and the second adjacent solar cell 125b. The two solar cells 125a and 125b can be located adjacent to each other such the metal foil 120a is under the substrate 100 of the first solar cell 125a and extends over the substrate 100b the solar cell 125b.

The metal foil 120a can be exposed to a laser beam 108, according to a LAMP technique, in locations over the conductive contact structures 110 and the solar cell 125b and the back side 131 of the solar cell 125a over the substrate 100. Exposing the metal foil 120a to the laser beam 108 forms a plurality of conductive contact structures electrically connecting the metal foil 120a to the back side 131 of the substrate 100a of solar cell 125a and a plurality of conductive contact structures electrically connecting the metal foil 120a to the substrate 100b of solar cell 125b, according to processes and resulting structures as previously disclosed. The conductive contact structures electrically connect regions of the substrate 100a and regions of the substrate 100b to the metal foil 120a, allowing for the flow of electrons to or from the substrate 100a and substrate 100b depending on the polarity of the connection.

FIG. 5 illustrates an exemplary string 175 of solar cells 125 utilizing metal foil 120, which can be formed according to methods and embodiments described herein. In exemplary string of solar cells, there are 5 solar cells, but there can be 2, 3, 4, 5, 6, 7, 8, 9, 10 or more solar cells connected in a solar cell string. For example, in a hypercell implementation that utilizes strips of solar cells that have been separated and made from an larger solar cell, 50 or 75 or more solar cell strips can be interconnected together utilizing a LAMP technique.

Figure 6:
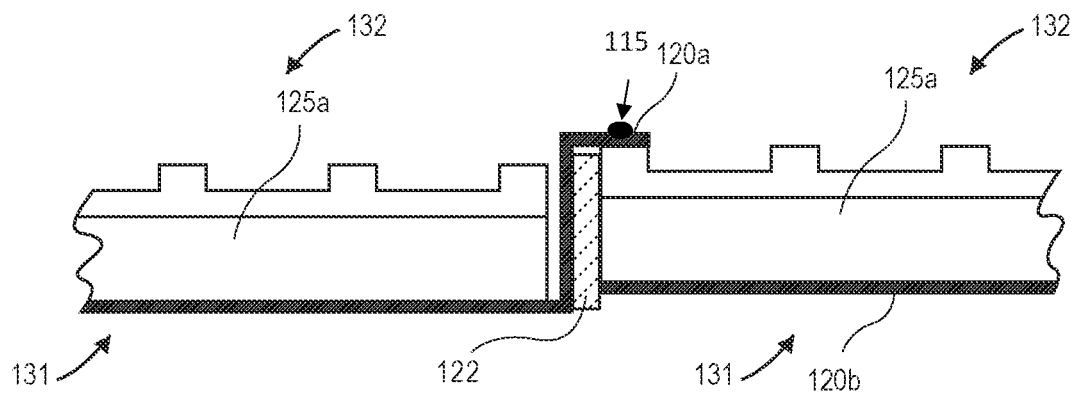
FIG. 6 illustrates a side view of operations a solar cell string.

As an additional example, FIG. 6 illustrates a side view of a solar cell string (two cells) with an intervening insulator.

Referring to FIG. 6, solar cells 125a and 125b are provided as described above with respect to FIGS. 1A-1F. The metal foil 120a is located over the back side 131 of the solar cell 125a. The metal foil 120a includes an insulating material 122, which, in some embodiments, is located and/or positioned on the metal foil 120a so that when the two solar cells 125a and 125b are connected and/or installed that the insulating material 122 can inhibit shorting between the metal foil 120a and a second solar cell 125b that is electrically connected to the first solar cell 125a. As described above with respect to FIGS. 1A-1F, the metal foil 120 is exposed to a laser beam in locations over the back side 131 of the solar cell 125a, to form a plurality of conductive contact structures electrically connected to the back side 131 of the substrate 100 electrically connect regions of the substrate 100 to the metal foil 120a. An electrically conductive bond 115 can be formed in locations over the conductive contact structures 110 the solar cell 125b to electrically connect the metal foil 120a to the conductive contact structures 110 of the solar cell 125b, in a manner as previously disclosed.

Figure 7:
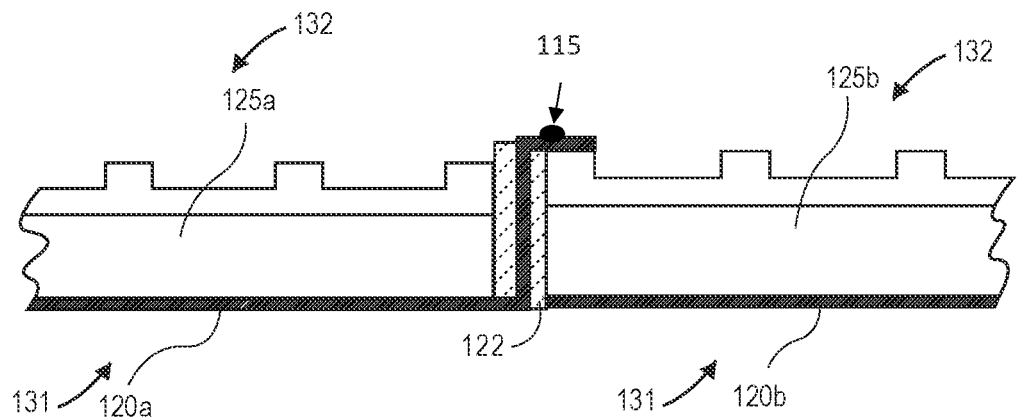
FIG. 7 illustrates a side view of operations a solar cell string.

As an additional example, FIG. 7 illustrates a side view of a solar cell string (two cells) with multiple intervening insulators. Referring to FIG. 7, solar cells 125a and 125b are provided as described above with respect to FIGS. 1A-1F. The metal foil 120a is located over the back side 131 of the solar cell 125. Referring to FIG. 7, the metal foil 120 is located over the back side 131 of the solar cell 125a. The metal foil 120 includes an insulating material 122 and 124, which, in some embodiments, is located and/or positioned on the metal foil 120a so that when the two solar cells are connected and/or installed that the insulating material 122 and 124 can inhibit shorting between the metal foil 120a and the first solar cell 125a or a second solar cell 125b that is electrically connected to the first solar cell 125a. As described above with respect to FIGS. 1A-1F, the metal foil 120 is exposed to a laser beam in locations over the back side 131 of the solar cell 125a, to form a plurality of conductive contact structures electrically connected to the back side 131 of the substrate 100 electrically connect regions of the substrate 100 to the metal foil 120a. An electrically conductive bond 115 can be formed in locations over the conductive contact structures 110 the solar cell 125b to electrically connect the metal foil 120a to the conductive contact structures 110 of the solar cell 125b, in a manner as previously disclosed.

Figure 8A:
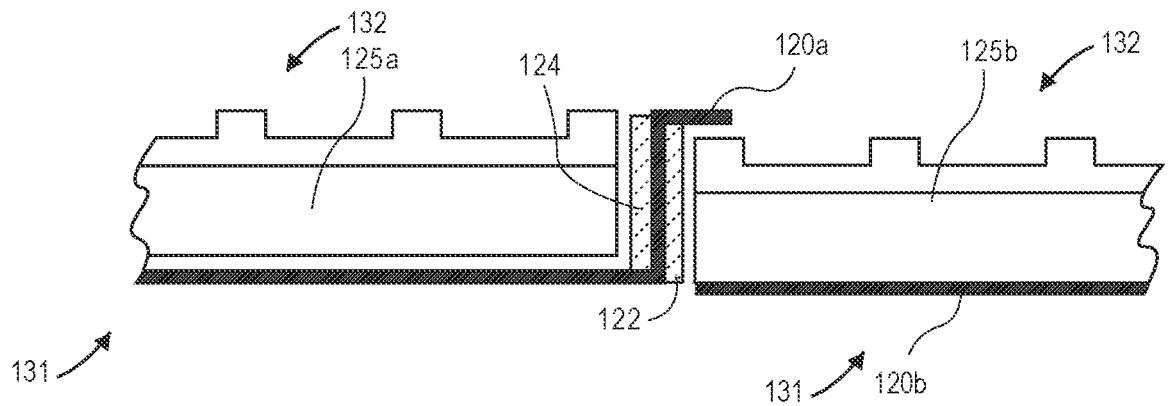
FIGS. 8A and 8B illustrate side views of operations in a method of fabricating a solar cell string.

Referring to FIG. 8A, a solar cell 125a is provided. The solar cell 125a can be any size or configuration that does not include a previously-provided back side metallization. In an embodiment, the solar cell 125a is one produced by the methods described herein and as exemplified by FIGS. 14A-14D. The solar cell 125a includes a plurality of conductive contact structures 110 electrically connected to the plurality of semiconductor regions in or above the substrate 100. The conductive contact structures 110 can be formed using a conventional technique or using a laser deposition process of a metal foil as disclosed herein. A second solar cell 125b is also provided prior to connecting a metal foil to the first solar cell 125a. Thus, further provided is a first metal foil 120a. Optionally, the metal foil 120a includes an insulating material 122 and/or 124, which, in some embodiments, is located and/or positioned on the metal foil so that when the two solar cells are connected and/or installed that the insulating material will inhibit shorting between the metal foil and the back side 131 of a second solar cell or front side of the first solar cell. The metal foil 120*a* can be pre-folded as shown in FIG. 8A or it can be unfolded. The foil 120*a* can be adhered to the first solar cell 125*a* via a vacuum, thermally, etc. An alignment method can be used to align 120*a* to 125*b*. Likewise. a second metal foil 120*b* can be provided and can be adhered to the second solar cell 125*b* via a vacuum, thermally, etc.

Figure 8B:
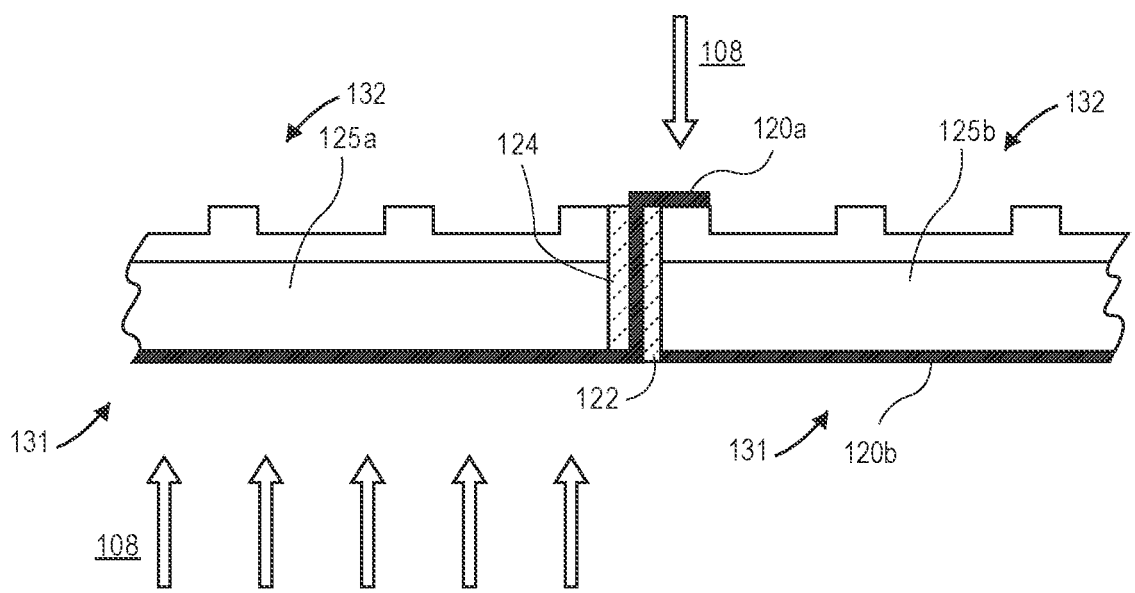

Referring to FIG. 8B the metal foil 120*a* can be located over the back side 131 of the solar cell 125*a* and the second adjacent solar cell 125*b*. The two solar cells 125*a* and 125*b* can be located adjacent to each other such the metal foil 120*a* is under the substrate 100 of the first solar cell 125*a* and extends over a metalized portion of the solar cell 125*b* (e.g., as shown) or, alternatively, right on the solar cell 125*b*. An electrically conductive bond 115 is formed in locations over the conductive contact structures 110 the solar cell 125*b* to electrically connect the metal foil 120*a* to the conductive contact structures 110 of the solar cell 125*b*. The electrically conductive bond 115 electrically connects conductive contact structures 110 to the metal foil 120*a*, allowing for the flow of electrons. Bonding can be performed in accordance as previously disclosed.

Figure 9:
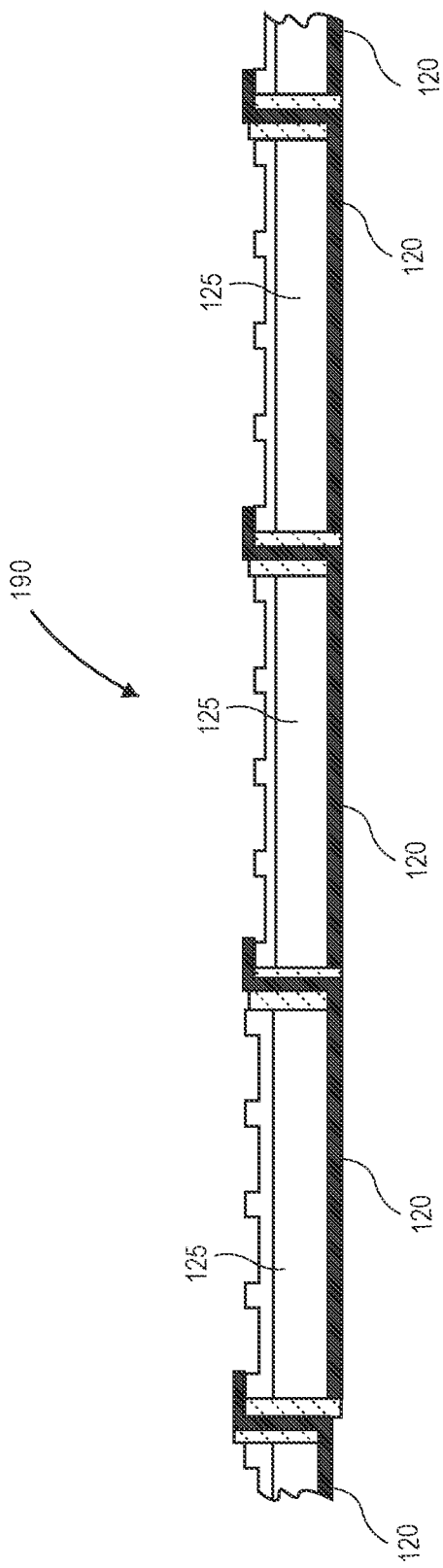
FIG. 9 illustrates a side view of a multi-solar cell string.

With reference to FIG. 9 a solar cell string can be expanded to a multi-solar cell string, that optionally includes an insulating material 122 and 124, which, in some embodiments, is located and/or positioned on the metal foil 120 so that when two adjacent solar cells 125 are connected and/or installed that the insulating material 122 and 124 can inhibit shorting between the metal foil 120 and solar cells. In addition, it is contemplated the multi-solar cell string(s) can be further coupled together to form solar cell arrays, for example by attachment of the busbar at the end of the string, in a parallel and/or serial arrangement.

Figure 10A:
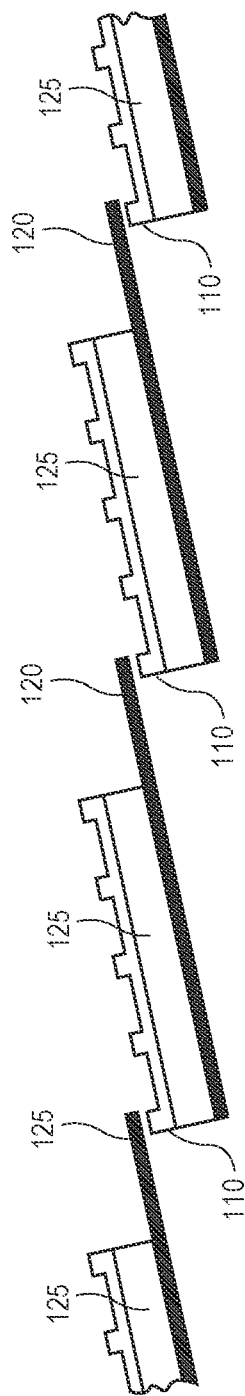
FIGS. 10A and 10B illustrate side views of operations in a method of fabricating a solar cell string.

Referring to FIG. 10A, a plurality of solar cells 125 are arranged so that the metal foil 120 which extends from one solar cell 125 can extend over a metalized portion 110 of an adjacent solar cell 125. In an embodiment, an alignment process can be performed to align the solar cells 125 and the metal foil 120 over a metalized portion 110 of an adjacent solar cell 125. In an embodiment, an automated process (e.g., using a robot or vision system) or a manual process can be used to arrange the metal foil 120 over the metalized portion 110 of an adjacent solar cell 125. As depicted in FIG. 10A, metal foil 120 extend across a gap between adjacent solar cells 120, however in other embodiments, and edge portion of one solar cell can overlap an edge portion of an adjacent solar cell in a shingled configuration such that the portion of the metal foil connecting adjacent solar cells is substantially covered or hidden between the overlapping edge portions.

Figure 10B:
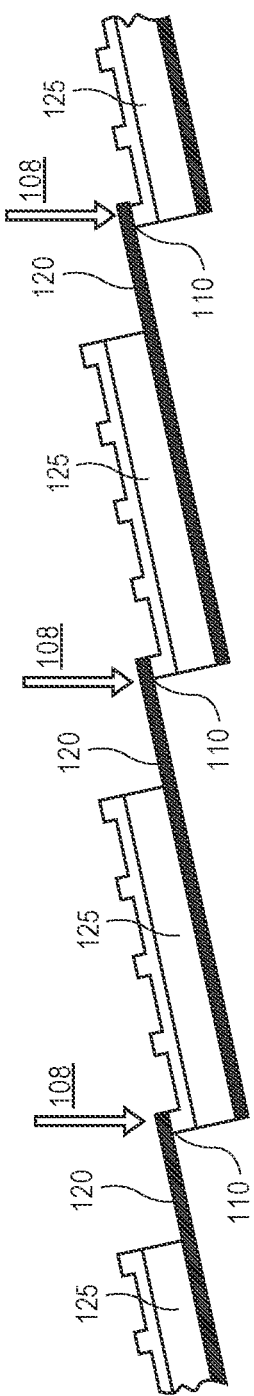

Referring to FIG. 10B, the metal foil 120 is exposed to a laser beam 108 in locations over the conductive contact structures 110 an adjacent solar cell 125. Exposing the metal foil 120 to the laser beam 108 forms a plurality of conductive contact structures electrically connecting the conductive contact structures 110 and the metal foil 120 of solar cell 125. The conductive contact structures electrically connect conductive contact structures 110 to the metal foil 120, allowing for the flow of electrons. The conductive contact structures can be uniformly distributed, patterned or otherwise distributed on the metal foil 120. Optionally, the foil 120 can be bent or folded to produce the solar cell string. Further, the overlapping portion of the foil 120 can be minimized to maximize spatial efficiency of the resulting string of cells. In a particular example, a gap between adjacent ones of the solar cells is approximately 1 mm.

Repeating this process for a number of adjacent solar cells, a very long hypercell can be formed. For example, when solar cell strips of approximately 1 inch by 6 inches are used for each of the solar cells 125, a hypercell of 50, 60, 70, 80, 100 or more solar cell strips can be formed. In this example, the LAMP technique of bonding adjacent solar cell strips can include a prior process of providing solar cell wafers (e.g., a number solar cell wafers of approximately 6 inches each), laser scribing the solar cell wafers to form approximately 1-inch wide solar cell strips from each of the solar cell wafers, and then cleaving such solar cell strips to separate the strips from each other. These resulting strips are then aligned to proceed with the LAMP techniques of bonding the strips together with metal foil.

FIG. 11 illustrates a further example building off of that shown in FIGS. 10A-10B. FIG. 11 illustrates exposing metal foil of a plurality of solar cells 125 to a laser beam 108 in locations over back sides and/or front sides of the solar cells 125, according to some embodiments. In an embodiment, a solar cell string can be formed by providing a plurality of solar cells 125 that are arranged so that the metal 120 extends from one solar cell 125 extends over a semiconductor substrate of an adjacent solar cell 125. The metal foil 120 can be exposed to a laser beam 108, or a plurality of laser beams 108 to form a plurality of conductive contact structures electrically connected to the back sides and/or front sides of the semiconductor substrates of the solar cells 125. In this way the metal foil 120 can be used to provide localization of the semiconductor substrate of an adjacent solar cell 125, for example, as described below, and/or connect the cells 125 as a solar cell string. In an embodiment, the conductive contact structures described here can be produced by the methods described herein and as exemplified by 14A-14D. In an embodiment, in contrast to as shown, a first laser beam 108, or a plurality of laser beams 108 can be applied to front sides of the solar cells 125 and subsequently, a second laser beam or a plurality of second laser beams 108 can be applied to the back sides of the solar cells 125. In an example, laser beams 108 can be applied to the front and back sides of solar cells in separate steps and/or in one process step as shown in FIG. 11. Also, the laser beams 108 can be applied sequentially, e.g., a front side 132 of one solar cell can be exposed to a laser beam 108, after which a back side 131 of an adjacent solar cell 125 can be exposed to a laser beam 108, and so on. Also, any ordering can be used, e.g., the front side 132 of a first solar cell 125 can be exposed to a laser beam, the front side 132 of another third solar cell 125 can be exposed to a laser beam, a back side 131 of a second solar cell can be exposed to a laser beam 108, etc.

FIG. 12 illustrates exposing metal foil of a plurality of solar cells 125 to a laser beam 108 in locations over back sides and/or front sides of the solar cells 125. In an embodiment, referring to FIG. 12, a solar cell string can be formed by providing a plurality of solar cells 125 that are arranged so that the metal 120 extends from one solar cell 125 extends over a seed layer 177 on the semiconductor substrate of an adjacent solar cell 125. The metal foil 120 can be exposed to a laser beam 108, or a plurality of laser beams 108 to form a plurality of conductive contact structures electrically connected to seed layers 177 of the solar cells 125, as shown. In an embodiment, the metal layer can be a metal seed layer. In an example, a metal seed layer can include a layer of deposited tin, tungsten, titanium, copper, silver and/or aluminum. In an example, a sputtering process can be used to deposit the metal seed layer.

The metal foil 120 can be exposed to a laser beam 108, or a plurality of laser beams 108 to form a plurality of conductive contact structures electrically connected to the front sides of the solar cells 125. In this way the metal foil can be used to provide localization of the semiconductor substrate of an adjacent solar cell 125, for example, as described below, and/or connect the cells 125 as a solar cell string. In an embodiment, the conductive contact structures described here can be produced by the methods described herein and as exemplified by 14A-14D. In an embodiment, similar to described in FIG. 11, a first laser beam 108, or a plurality of laser beams 108 can be applied to front sides of the solar cells 125 and subsequently, a second laser beam or a plurality of second laser beams 108 can be applied to the back sides of the solar cells 125. In an example, laser beams 108 can be applied to the front and back sides of solar cells in separate steps and/or in one process step as shown in FIG. 11. Also, the laser beams 108 can be applied sequentially, e.g., similar to as described in FIG. 11. Also, any ordering can be used, e.g., similar to as described in FIG. 11. In an embodiment, exposing the solar cells 125 to a laser beam 108 can be used to bond the metal foil 120 to the metal seed layers 177. In an example, the bonding process can include a welding process, such as laser welding.

Figure 13:
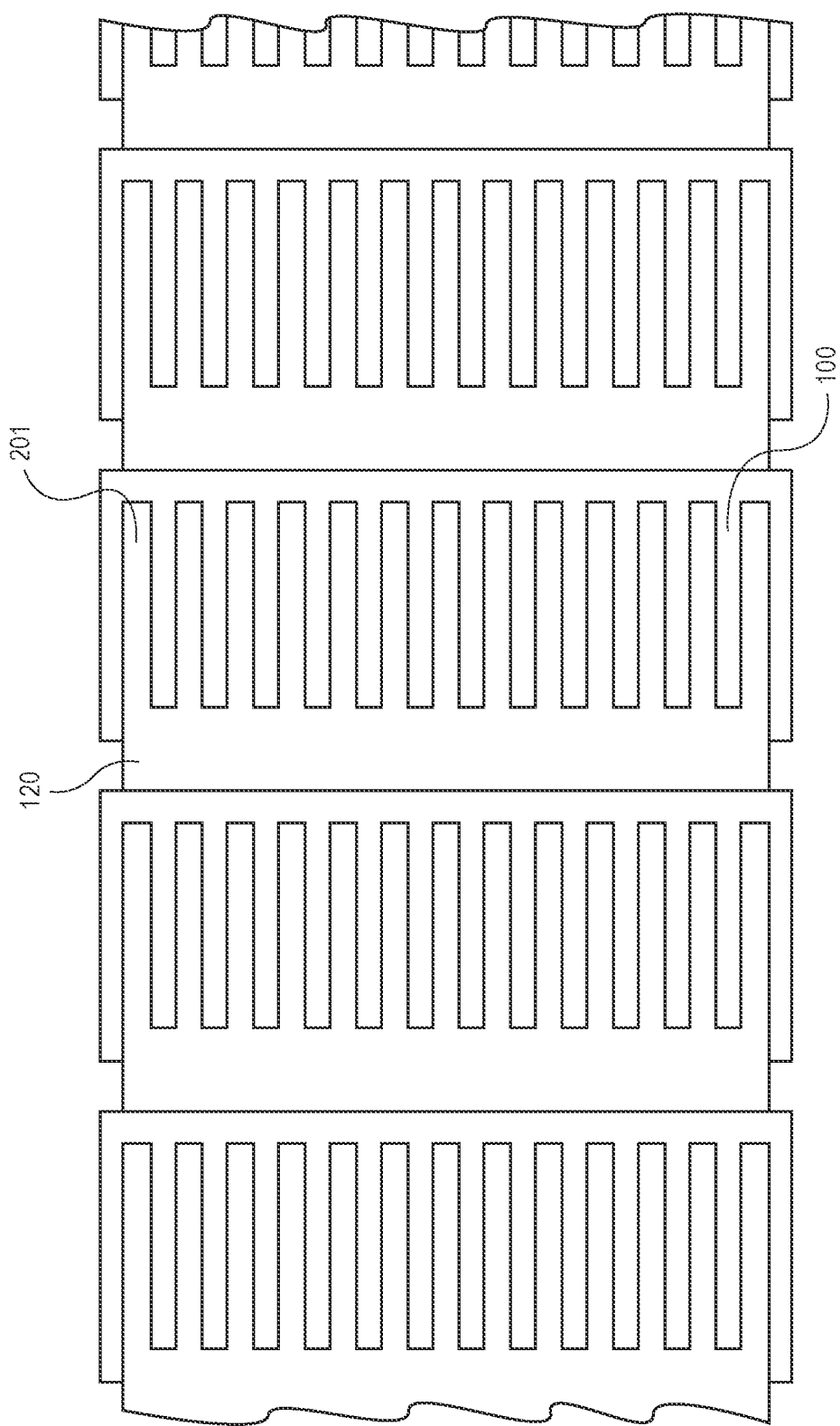
FIG. 13 is a plan view of a solar cell string.

FIG. 13 is a plan view of a solar cell string, according to some embodiments. As shown, a metal foil 120 and can electrically connect a plurality of solar cells 100. As described above, the metal foil can be electrically connected to the solar cells by locally deposited metal portion. Also as shown, the metal foil 120 can be located under one solar cell and over an adjacent solar cell, where the metal foil connects the solar cells in the solar cell string. Although, as shown, metal fingers 201 can extend from the metal foil 120, in some embodiments, the metal foil can end at a busbar portion of the solar cells 100 and another metallization structure can extend instead. In an example, the metal foil can be located over a busbar portion of the solar cells 100 and a metal paste, plated meal or another metal foil can be extend as metal fingers over the solar cells 100. The metal fingers 201 can be formed by removing portions of the metal foil 120 that are not processed by a LAMP technique.

FIGS. 14A-14D illustrate cross-sectional views of an exemplary solar cell at various operational steps in a method of fabricating the solar cell.

Figure 14A:
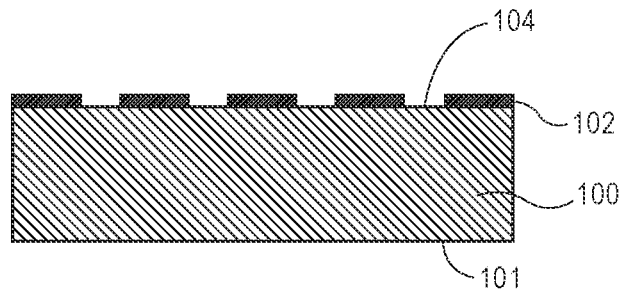
FIGS. 14A-14D illustrate cross-sectional views of various operations in a method of fabricating a solar cell.

Referring to FIG. 14A, an intervening layer 102 is formed on or above a solar cell substrate 100. Intervening layer 102 has openings 104 therein. While particular reference is made to forming the intervening layer on or above the substrate it is appreciated that the direction above is relative and that this intervening layer can be formed on the back, the front, or even the back and the front, of a selected substrate, for example, for metallization of the front, back, or both the front and back of the substrate.

Intervening layer 102 is formed either with openings 104 (e.g., patterned as deposited) or openings 104 are formed in a blanket-deposited intervening layer. In the latter case, in one embodiment, openings 104 are formed in intervening layer 102 by patterning with laser ablation and/or a lithography and etch process.

Intervening layer 102 can be formed on a backside of substrate 100 opposite a light-receiving side 101 of the substrate 100. Passivation and/or intervening layers (e.g., ARC) can also be formed on the back side of the substrate 100. Specifically, the intervening layer 102 can be a back anti-reflective layer (BARC).

The light receiving surface 101 can have a texturized light-receiving surface. A hydroxide-based wet etchant can be employed to texturize the light receiving surface 101 of the substrate 100. A texturized surface is one which has a regular or an irregular shaped surface for scattering incoming light, decreasing the amount of light reflected off of the light receiving surface 101 of the solar cell. Passivation and/or insulating (e.g., ARC) layers can be formed on the light-receiving surface 101.

While this disclosure is primarily directed to back-contact solar cells, the methods and techniques discussed herein, and specifically the LAMP techniques, can be applied to the metallization of a substrate in other solar cell types, such as front contact solar cells (e.g., PERC solar cells, mono-PERC solar cells, HIT solar cells, TopCon solar cells, (PERL) cells, and tandem cells, and other types of solar cells).

The openings 104 in intervening layer 102 can expose portions of a plurality of semiconductor regions formed in or above the substrate 100, including portions of a plurality of first semiconductor regions and second semiconductor regions formed in or above the substrate 100 (e.g., N-type and P-type semiconductor regions or vice versa). The substrate 100 can a monocrystalline silicon substrate, such as a bulk single crystalline N-type doped silicon substrate, or a layer, such as a multi-crystalline silicon layer, disposed on a monocrystalline solar cell substrate. The substrate 100 can have disposed therein/thereon N-type doped regions and P-type doped regions, portions of which are exposed by openings 104 in intervening layer 102. In a front contact solar cell implementation, the semiconductor regions on one side of the solar cell can be of the same conductivity type (e.g., P-type or N-type).

The N-type and/or P-type semiconductor regions can be disposed on a dielectric layer, such as a tunneling oxide layer including silicon oxide having a thickness of approximately 2 nanometers or less. The N-type and/or P-type semiconductor regions can be formed from polycrystalline silicon formed by, e.g., using a plasma-enhanced chemical vapor deposition (PECVD) process. The N-type polycrystalline silicon emitter regions can be doped with an N-type impurity, such as phosphorus, and the P-type polycrystalline silicon emitter regions can be doped with a P-type impurity, such as boron. In an embodiment, the N-type and P-type semiconductor regions are separated from one another. In an example, the N-type and P-type semiconductor regions have trenches or intrinsic (or lightly doped) regions formed there between. Trenches can extend partially into the substrate, and by covered by intervening layer 102. Lightly doped regions can have a doping concentration substantially less than the N-type and P-type semiconductor regions. The dielectric layer, e.g., a tunnel oxide or silicon dioxide layer, can be located between the N-type and P-type semiconductor regions, and can be located laterally between the N-type and P-type semiconductor regions.

Figure 14B:
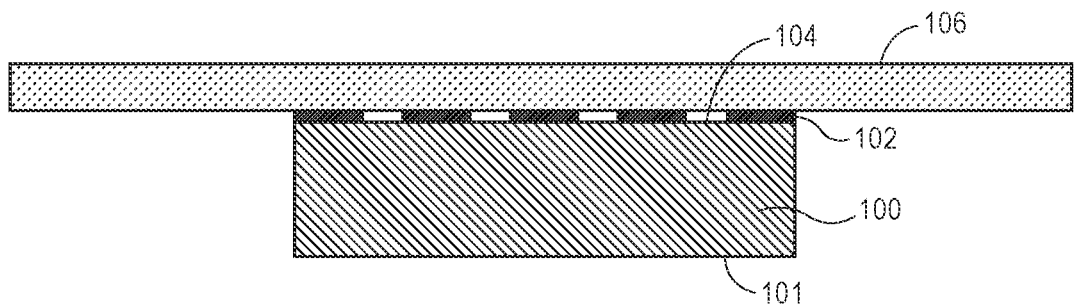

Referring to FIG. 14B, a metal foil 106 is located over the intervening layer 102. In an embodiment, locating the metal foil 106 over the intervening layer can include positioning the metal foil over the substrate 100. In an example, positioning the metal foil 106 over the substrate 100 can include covering the entire substrate 100. In an embodiment, portions of the metal foil 106 can be located over the substrate 100 and other portions can be located away, e.g., extend away from the substrate 100 in a lateral direction as shown in FIG. 14B. In an embodiment, in order to secure the metal foil 106 with the substrate 100, a locating process can be performed, including using a vacuum and/or a tacking process to hold the metal foil 106 in place over the substrate 100. In an example, the locating process includes performing a thermocompression process. In further example, a roller can be used to position or locate the metal foil 106 over the substrate 100. In an embodiment, the vacuum process, thermocompression process or other similar process can uniformly position the metal foil to inhibit air gaps or pockets of air between the metal foil and the substrate, as shown. In an example, a roller can be used to uniformly position the metal foil 106 over the substrate 100.

At the time of locating the metal foil 106 over the substrate 100, the metal foil 106 can have a surface area substantially larger than a surface area of the solar cell. In another embodiment, however, prior to placing the metal foil 100 over the solar cell, a large sheet of foil can be cut to provide the metal foil 106 having a surface area substantially the same as a surface area of the substrate 100. The metal foil can be laser cut, water jet cut, and the like, for example, prior to or even after placement on or above the substrate 100.

Figure 14C:
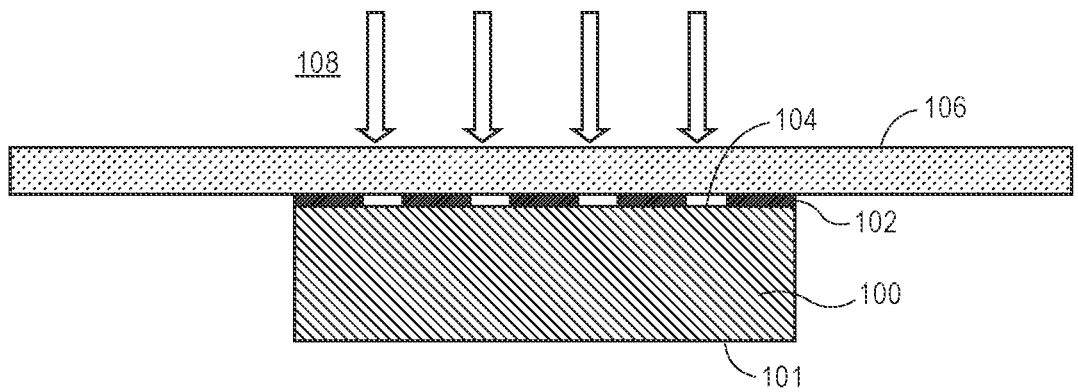

Referring to FIG. 14C, the metal foil 106 can be exposed to a laser beam 108 in locations over the openings 104 in the intervening layer 102 exposing portions of the semiconductor regions in or above the substrate 100. In an embodiment, regions of the metal foil 106 are selectively exposed to a laser beam 108 in locations at least partially over the openings 104 in the intervening layer 102. In some embodiments, the metal foil 106 is exposed to a laser beam 108 in locations offset, e.g., partially over or not over, the openings 104 in the intervening layer 102. In an example, the metal foil 106 is exposed to a laser beam 108 in locations adjacent to the openings 104.

Figure 14D:
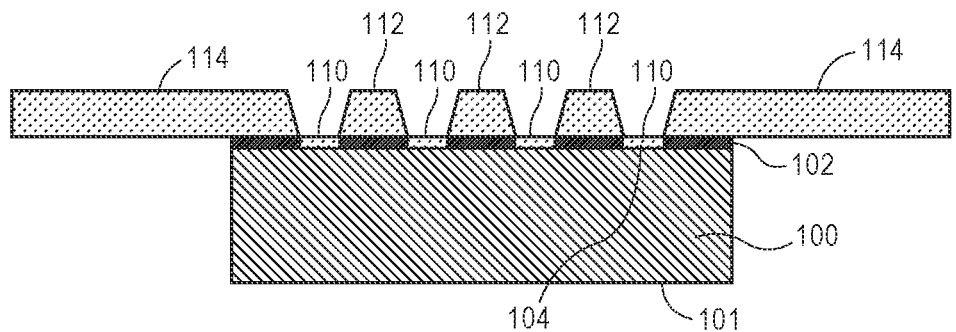

Referring to FIG. 14D, exposing the metal foil 106 to the laser beam 108 forms a plurality of conductive contact structures 110 electrically connected to the semiconductor regions in or above the substrate 100.

In accordance with one or more embodiments of the present disclosure, each conductive contact structure 110 is or includes a locally deposited metal portion. In one such embodiment, metal foil 106 acts as source or metal and is referred to as a local source since the metal foil 106 is first placed on a substrate surface. The metal foil 106 is then exposed to a laser process, e.g., exposure to a laser beam, that deposits metal from the metal foil 106 (metal source) onto portions of the substrate. It is to be appreciated that the resulting locally deposited metal portions can have an edge feature which can be distinguished from metal structure formed by other deposition processes such as plating, welding, or thermal bonding which can provide conformal structures absent an edge feature.

Referring again to FIG. 14D, second portions or portions 112 and 114 of the metal foil 106 not exposed to the laser beam 108 are retained on the intervening layer 102. The portions 112 are central portions, while the portions 114 are edge portions and can be overhang portions, as is depicted. In certain implementations, such second portions are not deposited or secured to the solar cell or the intervening layer 102. In an embodiment, the structure of FIG. 14D is implemented as a solar cell without removal of portions 112 and/or 114 of the metal foil 106. Such a structure can be used for a back surface metallization of a front contact solar cell.

With reference back to FIGS. 14A-14D, subsequent to exposing the metal foil 106 to the laser beam 108, portions 112 and 114 of the metal foil 106 can be removed, and portions 112 can be selectively exposed to the laser beam. An exemplary structure is depicted in FIGS. 15A-15C.

Figure 15A:
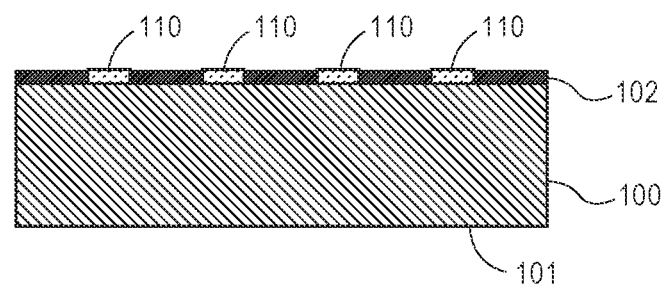
FIGS. 15A-15C illustrate cross-sectional views of a solar cell.
Figure 15B:
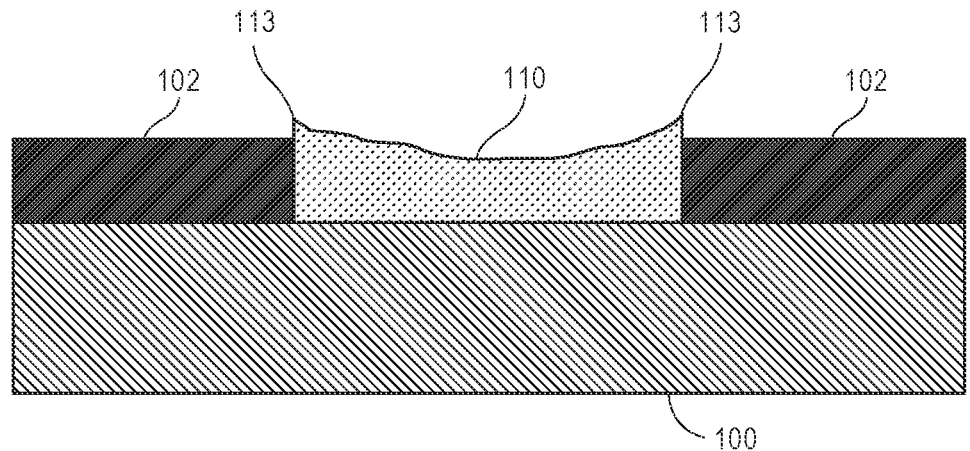
Figure 15C:
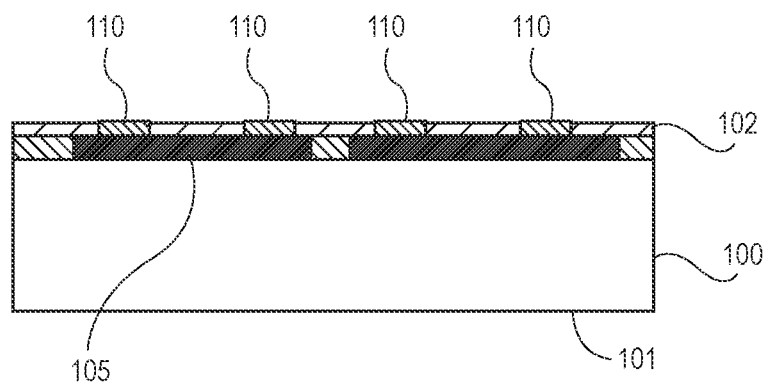

FIGS. 15A-15C illustrate cross-sectional views of a solar cell. As shown in FIG. 15A, removal of the second portions of the metal foil can leave behind the conductive contact structures 110 on the locations in the intervening layer 102 that have exposed portions of the plurality of N-type and/or P-type semiconductor regions in or above the substrate 100. In FIG. 15B, the formation of sharp or torn edge features 113 on either side of the conductive contact structures 110 is shown. These edge features 113, as described above, are formed from the removal the second portions of the metal foil not exposed to the laser beam. In some embodiments, some portions 112 and 114 are removed and other portions 112 and 114 remain. In an embodiment, exposing the metal foil 106 to the laser beam 108 includes removing all or substantially all portions of the metal foil not exposed to the laser beam.

FIG. 15C shows the position of N-type and/or P-type semiconductor regions 105. In the embodiment shown, N-type and/or P-type semiconductor regions 105 are separated from one another, and each semiconductor region has two conductive contact structures 110. Alternatives, not shown, include one, three or more conductive contact structures per semiconductor region. In an example, the N-type and/or P-type semiconductor regions can have trenches formed there between, the trenches extending partially into the substrate, and covered by intervening layer 102. In one example, N-type and/or P-type semiconductor regions can be separated by an intrinsic or lightly doped region there between, e.g., where the lightly doped regions can have a doping concentration substantially less than the N-type and/or P-type semiconductor regions. In some embodiments, the semiconductor regions 105 can have the same conductivity type, are all N-type or P-type, as in some front contact solar cells. It is contemplated that the conductive contact structures 110 can be reinforced with a second metal source as described, as described above.

With reference back to FIGS. 14A-14D, subsequent to applying a laser beam 108 to the metal foil 106, in an example, only portions 114 of the metal foil 106 not exposed to the laser beam 108 are removed, while some portions 112 of the metal foil 106 are retained. In an embodiment, portions 112 can be selectively exposed to the laser beam 108 or a different/subsequent laser beam, which can use the same laser at different laser settings/variables.

Figure 16:
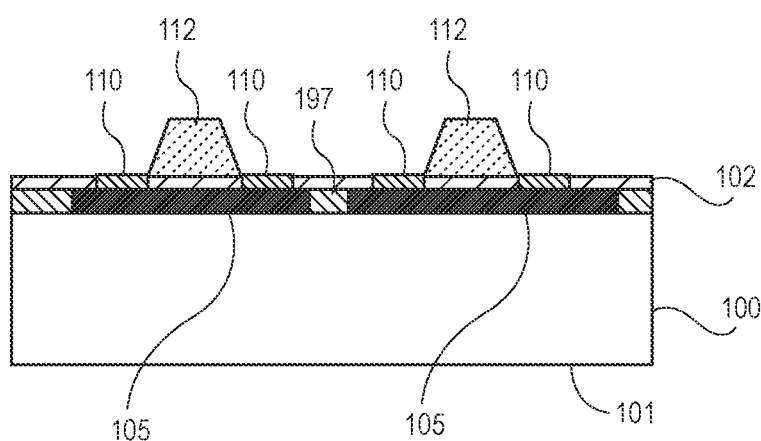
FIG. 16 illustrates a cross-sectional view of a solar cell.

FIG. 16 illustrates a cross-sectional view of a solar cell. As shown in FIG. 16, the laser forms the conductive contact structures 110 and portions 112 above the intervening layer 102, such as an ARC or BARC layer. Portions 114 have been removed. The position of N-type and/or P-type semiconductor regions 105. In one example, N-type and/or P-type semiconductor regions are separated, for example by a lightly doped region 197 there between, e.g., where the lightly doped regions can have a doping concentration substantially less than the N-type and/or P-type semiconductor regions. In some embodiments, the semiconductor regions 105 can have the same conductivity type, are all N-type or P-type, as in some front contact solar cells. It is contemplated that the conductive contact structures 110 can be reinforced with a second metal source as described, as described above. It is further contemplated that the portions 112 can formed from a second metal source as described, as described above.

FIGS. 17A-17E illustrates example semiconductor substrates fabricated using methods, approaches or equipment described herein, according to some embodiments. The semiconductor substrates are solar cells 1520a-e and can include a silicon substrate 1525. The silicon substrate 1525 can be cleaned, polished, planarized and/or thinned or otherwise processed. The semiconductor substrate 1525 can be a single-crystalline or a multi-crystalline silicon substrate, N-type or P-type. The solar cells can have a front side 1502 and a back side 1504, where the front side 1502 is opposite the back side 1504. The front side 1502 can be referred to as a light receiving surface 1502 and the back side 1504 can be referred to as a back surface 1504. The solar cells can include a first doped region 1521 and a second doped region 1522. In an embodiment, the first doped region can be a P-type doped region (e.g., doped with boron) and the second doped region can be an N-type doped region (e.g., doped with phosphorus). The solar cells 1520a-e can include an intervening layer (e.g., anti-reflective coating ARC) 1528 on the front side 1502 of the solar cells. The solar cells 1520a-e can include a back intervening layer (e.g., back anti-reflective coating BARC) 1526 on the back side 1504 of the solar cells.

Figure 17A:
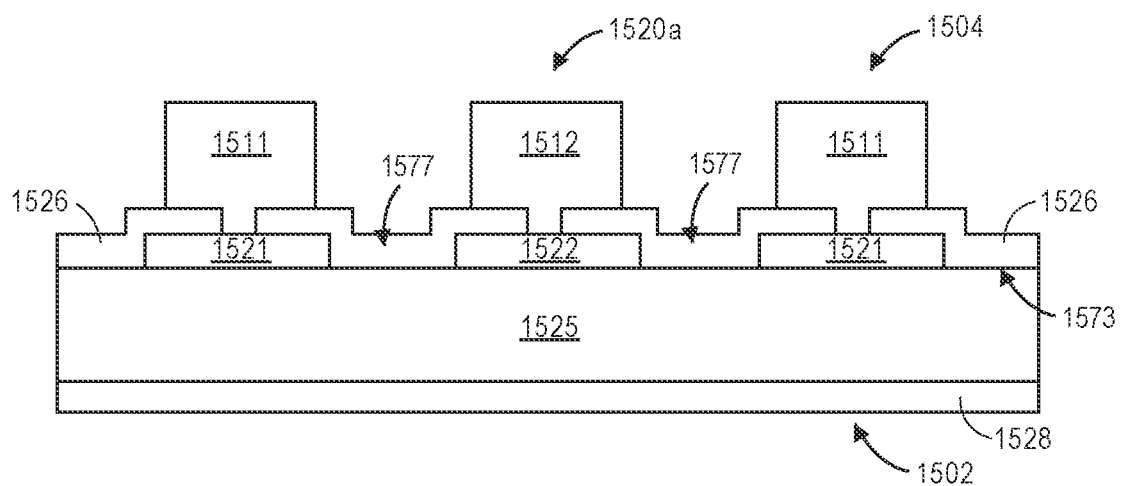
FIGS. 17A-17E illustrates example substrates fabricated using methods, approaches or equipment described herein.

FIG. 17A illustrates an exemplary back-contact solar cell fabricated using methods, approaches or equipment described herein. The back-contact solar cell 1520a can include the first and second doped regions 1521, 1522 disposed on a back side 1504 of a solar cell 1520a. In an example, the first and second doped regions 1521, 1522 can be doped semiconductor regions. The first and second doped regions 1521, 1522 can be doped polysilicon regions. A thin oxide layer 1573 (e.g., tunnel oxide layer) can be disposed between the first and second doped regions 1521, 1522 and the substrate 1525. The first and second doped regions 1521, 1522 can, instead, be located in the substrate 1525. Conductive contact structures 1511, 1512 are located on the back side 1504 of the solar cell 1520a, where the conductive contact structures 1511, 1512 include locally deposited metal on the first and second doped regions 1521, 1522. The first and second doped regions 1521, 1522 can have separation regions 1577 formed there between. In an example, the first and second doped regions 1521, 1522 have trenches formed there between, the trenches extending partially into the substrate, and covered by intervening layer 1562. The trenches can be replaced with intrinsic or lightly doped semiconductor regions.

Figure 17B:
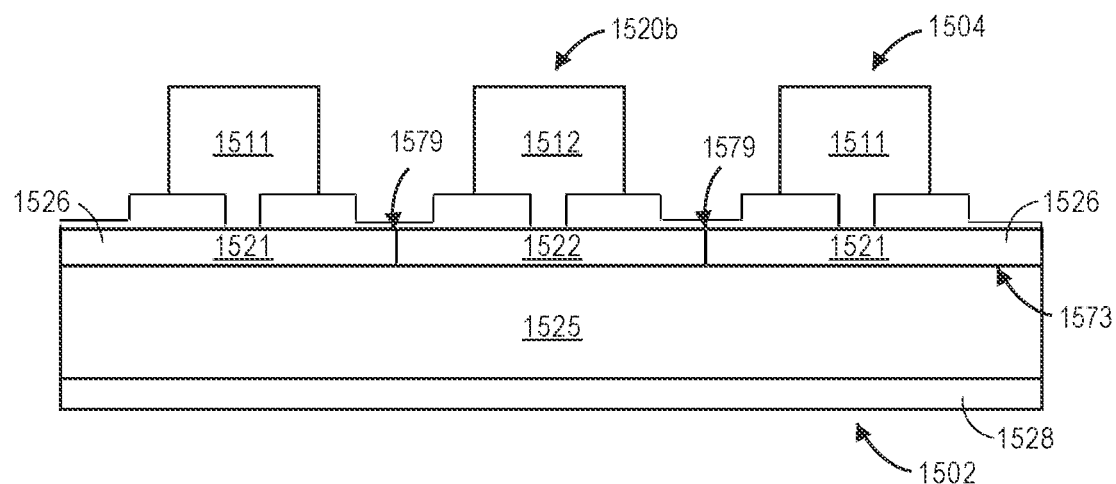

FIG. 17B illustrates another example of a back-contact solar cell 1520b fabricated using methods, approaches or equipment described herein, according to some embodiments. The back-contact solar cell 1520b can include the first and second doped regions 1521, 1522 disposed on a back side 1504 of a solar cell 1520b. In an example, the first and second doped regions 1521, 1522 can be doped semiconductor regions that extend in a continuous layer. In one example, first and second doped regions 1521,1522 are separated by a lightly doped region 1579 there between, e.g., where the lightly doped regions can have a doping concentration substantially less than the first and second doped regions 1521, 1522. In an embodiment, a thin oxide layer 1573 (e.g., tunnel oxide layer) can be disposed between the first and second doped regions 1521, 1522 and the substrate 1525. In a particular embodiment, the first and second doped regions 1521, 1522 can be doped polysilicon regions. The first and second doped regions 1521, 1522 can, instead, be located in the substrate 1525. In an embodiment, conductive contact structures 1511, 1512 on the back side 1504 of the solar cell 1520c, where the conductive contact structures 1511, 1512 include locally deposited metal on the first and second doped regions 1521, 1522 formed via a LAMP technique.

Figure 17C:
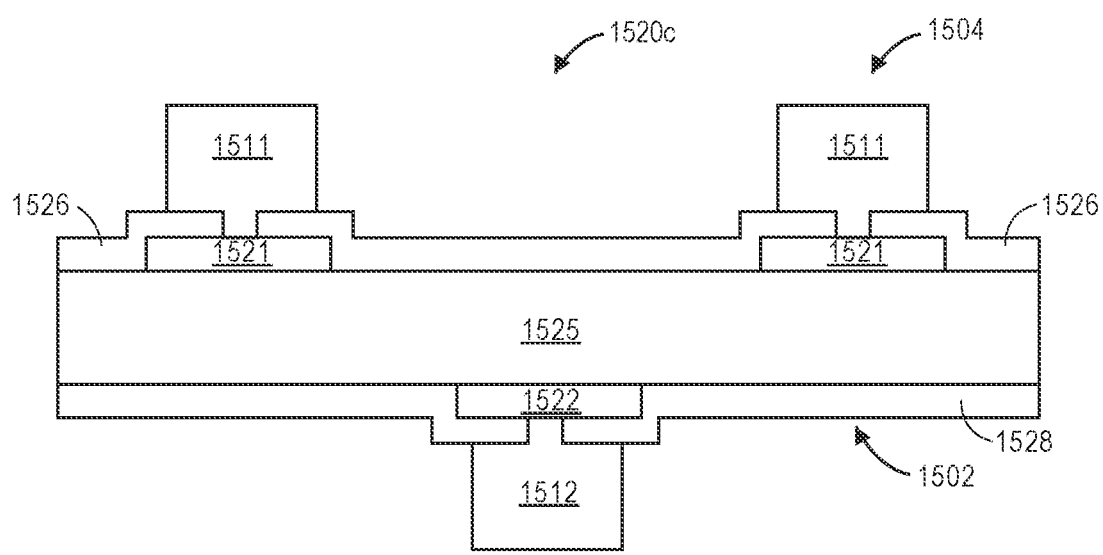

FIG. 17C illustrates an example front-contact solar cell fabricated using methods, approaches or equipment described herein, according to some embodiments. The front-contact solar cell 1520c can include the first doped regions 1521 disposed on the back side 1504 of the solar cell 1520c. In an example, the second doped region 1522 can be disposed on the front side 1502 of the solar cell 1520c. Although one example of a second doped region 1522 is shown, one or more, of the second doped region 1522 can be used. Conductive contact structures 1511, 1512 can be on the front and back sides 1504 of the solar cell 1520c, where the conductive contact structures 1511, 1512 include locally deposited metal on the first and second doped regions 1521, 1522 formed via a LAMP technique. The second doped region 1522 can offset from the first doped regions 1521, as shown. The second doped region 1522 can be aligned, e.g., vertically aligned with, the first doped regions 1521.

Figure 17D:
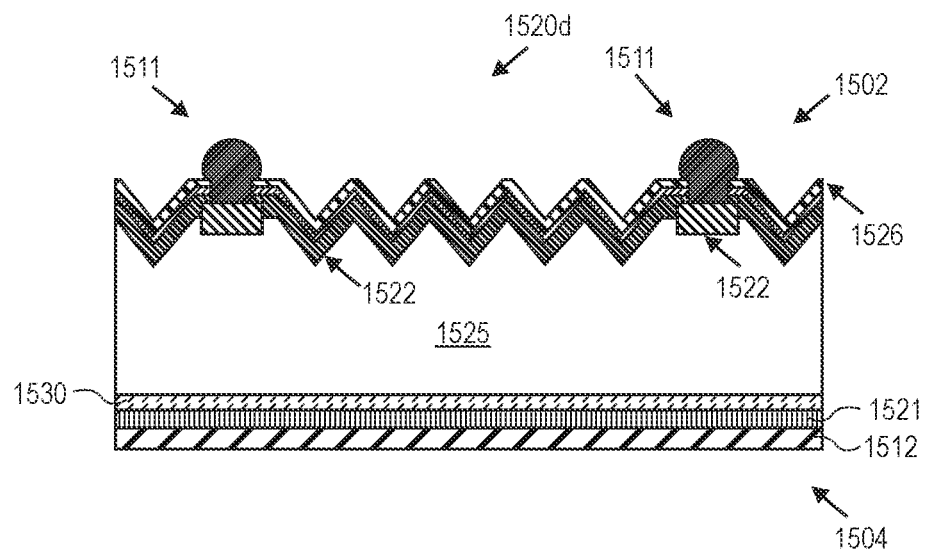

FIG. 17D illustrates an example front-contact solar cell fabricated using methods, approaches or equipment described herein, according to some embodiments. The front-contact solar cell 1520d can include the first doped regions 1521 disposed on the back side 1504 of the solar cell 1520d. Conductive contact structures 1511, 1512 can be formed via a LAMP technique on the front and back sides 1502, 1504 of the solar cell 1520d, respectively, where the conductive contact structures 1511, 1512 include locally deposited metal on the first and second doped regions 1521, 1522. The first and second doped regions 1521, 1522 can include an amorphous silicon region. The solar cell 1520d can include an intervening layer (e.g., an anti-reflective layer coating ARC) 1526 on the front side 1502 of the solar cell 1520d. The solar cells 1520d can include a back intervening layer (e.g., a back anti-reflective coating BARC) 1526 on the back side 1504 of the solar cell 1520d. A thin oxide layer 1530 can be disposed between the first doped region 1521 and the substrate 1525.

Figure 17E:
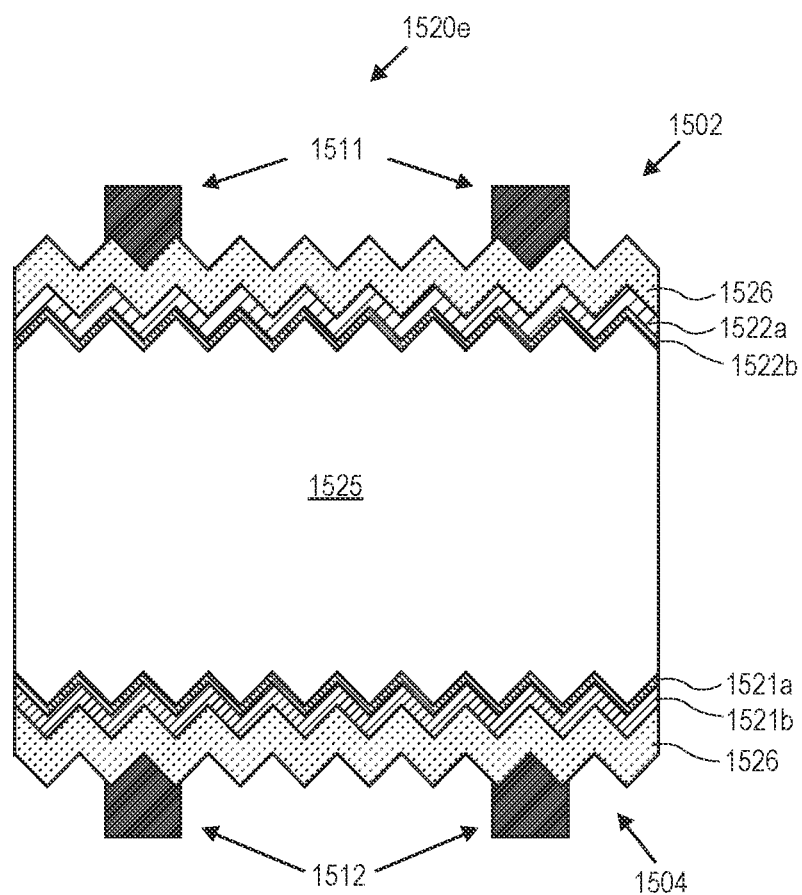

FIG. 17E illustrates another exemplary front-contact solar cell fabricated using methods, approaches or equipment described herein, according to some embodiments. The solar cell 1520e can include the first doped regions 1521a, 1521b disposed on the back side 1504 of the solar cell 1520e. In an example, the second doped region 1522a, 1522b can be disposed on the front side 1502 of the solar cell 1520d. In an embodiment, conductive contact structures 1511, 1512 can be formed via a LAMP technique on the front and back sides 1504 of the solar cell 1520b, respectively, where the conductive contact structures 1511, 1512 include locally deposited metal on the first and second doped regions 1521a, 1521b, 1522a 1522b. The first doped regions 1521a, 1521b can include a doped polysilicon region. The solar cell 1520e can include an intervening layer (e.g., an anti-reflective coating ARC) 1526 on the front side 1502 of the solar cell 1520e. The solar cells 1520e can include a back intervening layer (e.g., an back anti-reflective coating BARC) 1526 on the back side 1504 of the solar cell 1520e.

Figure 18A:
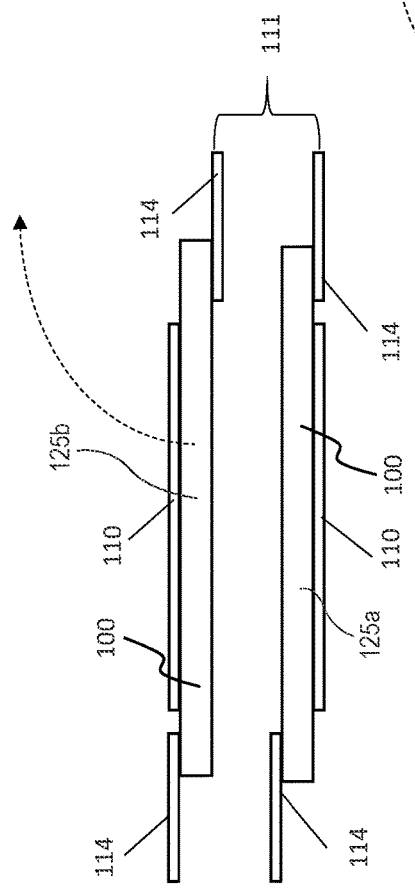
FIGS. 18A-18C illustrate side views of operations in a method of fabricating a solar cell string.
Figure 18B:
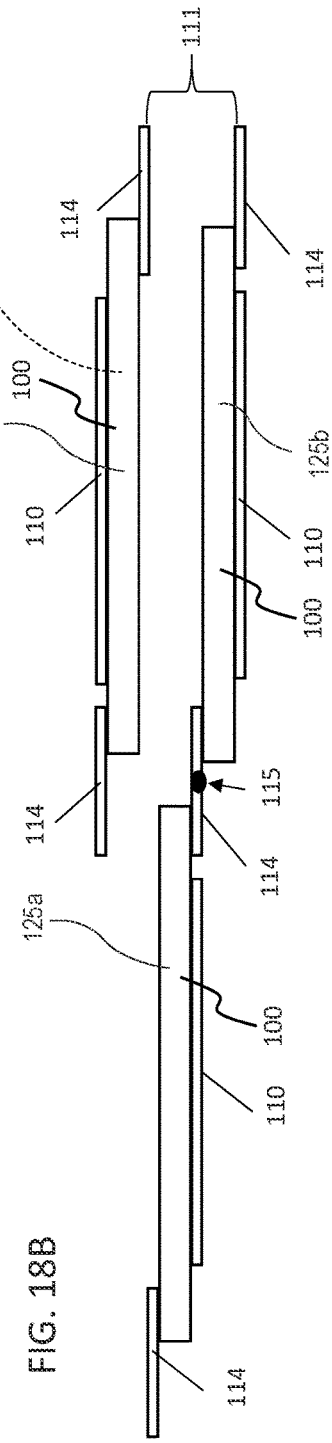
Figure 18C:
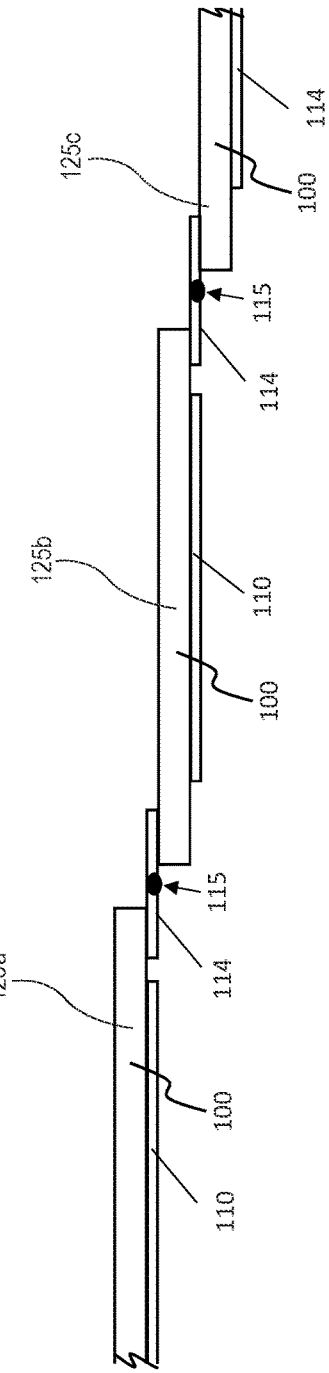

FIGS. 18A-18C illustrate side views of operations in a method of fabricating a solar cell string, in accordance with an embodiment of the present disclosure. Referring to FIG. 21A, two solar cells 125a and 125b including substrates 100 are provided such as described above. The substrates include a plurality of conductive contact structures 110 electrically connected to the substrates 100 and second portions 114 of the metal foil 106 not exposed to the laser beam 108 are retained on the substrates 100, overhanding and/or extending from the substrates 100. While shown as separate conductive contact structures 110 and second portions 114 can be continuous. The solar cells 125a and 125b are stacked together in the same orientation. The second portions 114 are bonded together at position 111 to form a bond 115 as shown in FIG. 18B. In an embodiment, the bonding can be done by a laser process as described herein. In an embodiment, the bonding is a welding process, such as laser welding, ultrasonic welding or induction welding. In embodiment, the bond can be formed by thermocompression bonding. In an embodiments the bonding is accomplished with a conductive adhesive. Two solar cells can be attached using this process as well. The solar cells 125a and 125b can be unfolded as depicted by the arrow to form a linear string. As shown in FIG. 18B that process can be repeated multiple times to create on almost limitless string, such as by adding solar cell 125c as depicted in FIG. 18B. Although, there are 3 solar cells shown in FIG. 18C, there can be 2, 3, 4, 5, 6, or more solar cells connected in a solar cell string. In addition different procedures and steps can be performed to form the solar cell strings shown. In an embodiment strings of solar cells can be connected together by stacking the strings together, and bonding the metal foil extending from one solar cell at the end of a first solar cell string to a complementary metal foil extending from a solar cell at the end of a second solar string that is stacked over the first solar cell string.

Figure 19A:
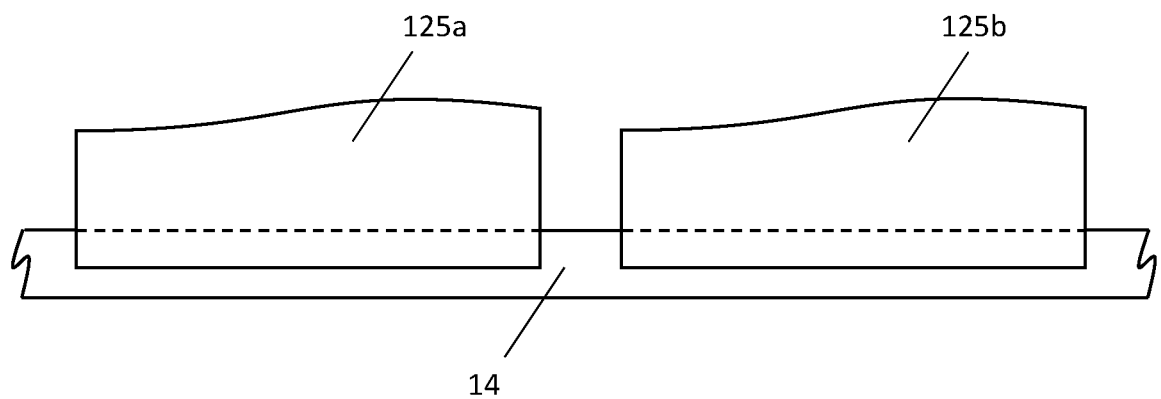
FIGS. 19A-19B illustrate side illustrates a view of an exemplary interconnection of a metal ribbon to solar cells.
Figure 19B:
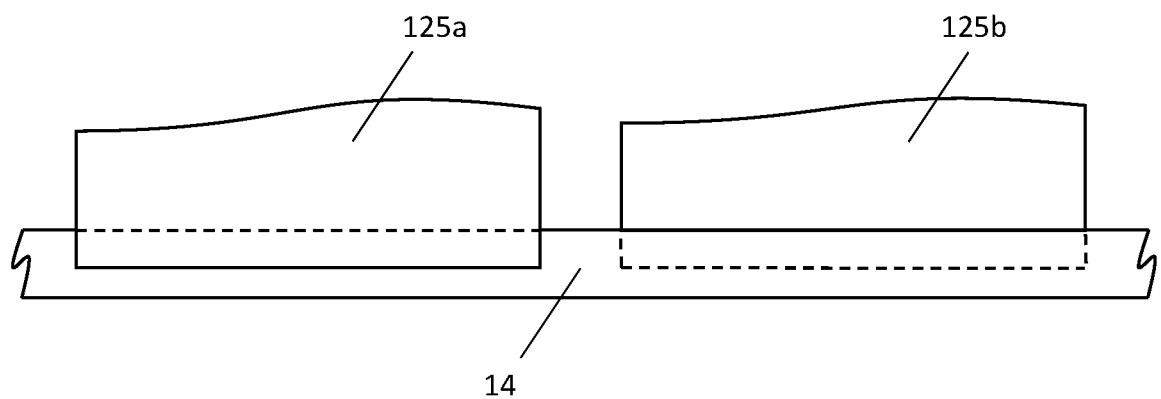

FIGS. 19A and 19B illustrate an expanded views of an exemplary interconnection of the metal ribbon 14 to the solar cells 125a and 125b, for example at the end of a string of solar cells. With reference to FIG. 19A, the metal ribbon 14 is connected to the backside of each of solar cells 125a and 125b, for example forming a set of two (or more) solar cell strings connected in parallel. With reference to FIG. 19B, the metal ribbon 14 is connected to the backside of solar cells 125a and the front side of solar cell 125b, for example forming a set of two (or more) solar cell strings connected in series. As shown in FIG. 19B, the metal ribbon 14 can be threaded or woven in an over/under configuration between adjacent strings of solar cells. The metal ribbon 14 can extend at either end, for example, to electrically connect to additional strings and/or other components of a solar cell array, matrix and/or system.

Although certain materials are described specifically with reference to above described embodiments, some materials can be readily substituted with others with such embodiments remaining within the spirit and scope of embodiments of the present disclosure. For example, in an embodiment, a different material substrate, such as a group III-V material substrate, can be used instead of a silicon substrate. In another embodiment, any type of substrate used in the fabrication of micro-electronic devices can be used instead of a silicon substrate, e.g., a printed circuit board (PCB) and/or other substrates can be used. Additionally, although reference is made significantly to back contact solar cell arrangements, it is to be appreciated that approaches described herein can have application to front contact solar cells as well. In other embodiments, the above described approaches can be applicable to manufacturing of other than solar cells. For example, manufacturing of light emitting diode (LEDs) can benefit from approaches described herein.

Additionally, although solar cells are described in great detail herein, the methods and/or processes described herein can apply to various substrates and/or devices, e.g., semiconductor substrates. For example, a semiconductor substrate can include a solar cell, light emitting diode, microelectromechanical systems and other substrates.

Furthermore, although many embodiments described pertain to directly contacting a semiconductor with a metal foil as a metal source. Concepts described herein can also be applicable to solar applications (e.g., HIT cells) where a contact is made to a conductive oxide, such as indium tin oxide (ITO), rather than contacting a semiconductor directly. Additionally, embodiments can be applicable to other patterned metal applications, e.g., PCB trace formation.

Thus, local metallization of semiconductor substrates using a laser beam, and the resulting structures are presented.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims can be formulated during prosecution of this application (or an application claiming priority thereto) to any such combination of features. In particular, with reference to the appended claims, features from dependent claims can be combined with those of the independent claims and features from respective independent claims can be combined in any appropriate manner and not merely in the specific combinations enumerated in the appended claims.

What is claimed is:

1. A method of fabricating a solar cell string, the method comprising:
   providing a first solar cell having a front side and a back side, wherein the front side is a light-receiving side of the first solar cell;
   providing a second solar cell having a front side and a back side, wherein the front side is a light-receiving side of the second solar cell;
   disposing a metal foil over the backside of the first solar cell and over the front side of the second solar cell;
   forming one or more laser assisted metallization conductive contact structures each having a discrete locally deposited metal portion electrically connected to the back side of the first solar cell, wherein the discrete locally deposited metal portion of each of the one or more laser assisted metallization conductive contact structures is formed from the metal foil and is separated from an entirety of the metal foil such that the discrete locally deposited metal portion is not connected to the entirety of the metal foil; and
   forming one or more laser assisted metallization conductive contact structures each having a discrete locally deposited metal portion electrically connected to the front side of the second solar cell, wherein the discrete locally deposited metal portion of each of the one or more laser assisted metallization conductive contact structures is formed from the metal foil and is separated from an entirety of the metal foil such that the discrete locally deposited metal portion is not connected to the entirety of the metal foil.

2. The method of claim 1, wherein the foil extends over a portion of the front side of the second solar cell.

3. The method of claim 1, wherein the second solar cell comprises one or more contact pads, and wherein the metal foil is electrically connected to the one or more contact pads of the second solar cell.

4. The method of claim 1, further comprising:
   electrically connecting one or more additional solar cells to the first solar cell or the second solar cell.

5. The method of claim 1, further comprising:
 forming an insulating material over at least a portion of the metal foil.

6. The method of claim 1, wherein the metal foil is folded between the first solar cell and the second solar cell.

7. The method of claim 1, where the first and second solar cells include P-type and N-type doped diffusion regions.

8. The method of claim 1, further comprising:
 forming a cloaking material over a portion of the metal foil between the solar cells.

* * * * *